US012749553B2

(12) United States Patent
Yun et al.

(10) Patent No.: US 12,749,553 B2
(45) Date of Patent: Sep. 29, 2026

(54) MEMORY CONTROLLER CAPABLE OF PERFORMING MULTIPLE OPERATIONS, AN OPERATION METHOD THEREOF, A MEMORY DEVICE, AND A MEMORY SYSTEM

(71) Applicant: SAMSUNG ELECTRONICS CO., LTD., Suwon-si (KR)

(72) Inventors: Changho Yun, Suwon-si (KR); Sungjoon Kim, Suwon-si (KR); Yukyoung Kim, Suwon-si (KR); Chaeeun Lee, Suwon-si (KR); Jongwon Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 386 days.

(21) Appl. No.: 18/226,340

(22) Filed: Jul. 26, 2023

(65) Prior Publication Data

US 2024/0212782 A1 Jun. 27, 2024

(30) Foreign Application Priority Data

Dec. 26, 2022 (KR) ........................ 10-2022-0185020

(51) Int. Cl.
*G11C 29/44* (2006.01)
*G11C 29/12* (2006.01)
*G11C 29/46* (2006.01)

(52) U.S. Cl.
CPC .......... *G11C 29/46* (2013.01); *G11C 29/1201* (2013.01); *G11C 29/44* (2013.01)

(58) Field of Classification Search
CPC ..... G11C 29/1201; G11C 29/46; G11C 29/44; G11C 2029/1206; G11C 29/12; G11C 11/401-4099
See application file for complete search history.

(56) References Cited

U.S. PATENT DOCUMENTS 8,386,833 B2 2/2013 Smith et al.
9,449,717 B2 9/2016 Becker et al.
(Continued)

FOREIGN PATENT DOCUMENTS

KR 10-2006-0021440 3/2006
KR 10-2288558 8/2021

OTHER PUBLICATIONS

EESR issued in corresponding Application No. EP Patent Application No. 23194916.5 on Feb. 29, 2024.

*Primary Examiner* — Alfredo Bermudez Lozada
(74) *Attorney, Agent, or Firm* — Morgan, Lewis & Bockius LLP

(57) ABSTRACT

A memory system including: a memory module including a plurality of memory chips; a mirror memory module including a plurality of mirror memory chips corresponding to the plurality of memory chips, a first mirror memory chip of the plurality of mirror memory chips being storing same data as a first memory chip of the plurality of memory chips; and a memory controller configured to, in a system running state in which an operation according to a request of a user is capable of being performed after the memory system is booted, provide the memory module with a command for instructing a normal operation to be performed and provide the mirror memory module with a command for instructing a memory built-in self-test (MBIST) to be performed.

15 Claims, 19 Drawing Sheets

(56) References Cited

U.S. PATENT DOCUMENTS

| | | | | |
|---|---|---|---|---|
| 2006/0282722 | A1 | 12/2006 | Co et al. | |
| 2007/0204190 | A1 | 8/2007 | Hesse et al. | |
| 2008/0010435 | A1 * | 1/2008 | Smith | G06F 13/1668 712/10 |
| 2010/0174955 | A1 | 7/2010 | Carnevale et al. | |
| 2010/0235691 | A1 | 9/2010 | Chen | |
| 2013/0138901 | A1 | 5/2013 | Cordero et al. | |
| 2014/0192583 | A1 | 7/2014 | Rajan et al. | |
| 2017/0344421 | A1 | 11/2017 | Brandl | |
| 2020/0321070 | A1 | 10/2020 | Hanagandi et al. | |
| 2022/0148675 | A1 | 5/2022 | Chin et al. | |
| 2022/0293207 | A1 * | 9/2022 | Benedict | G11C 29/4401 |

* cited by examiner

FIG. 16

1600

MODE REGISTER

1610

| OP7 | OP6 | OP5 | OP4 | OP3 | OP2 | OP1 | OP0 |
|---|---|---|---|---|---|---|---|
| Rx CS_n CTLE Control (Optional) | Rx CA CTLE Control (Optional) | | Rx CTLE Support | MBIST/mPPR Transparency (Optional) | | | |

1620

| FUNCTION | TYPE | OP CODE (OP[2:0]) | DESCRIPTION/DATA |
|---|---|---|---|
| MBIST/mPPR Transparency (optional) | R | 000b | MBIST has not run since INIT or no fails remain after most recent run (default) |
| | | 001b | Fails remain |
| | | 010b | Unrepairable fails remain |
| | | 011b | MBIST should be run again |
| | | 100b–111b | Reserved |

MEMORY CONTROLLER CAPABLE OF PERFORMING MULTIPLE OPERATIONS, AN OPERATION METHOD THEREOF, A MEMORY DEVICE, AND A MEMORY SYSTEM

CROSS-REFERENCE TO RELATED APPLICATION

This application claims priority under 35 U.S.C. § 119 to Korean Patent Application No. 10-2022-0185020, filed on Dec. 26, 2022, in the Korean Intellectual Property Office, the disclosure of which is incorporated by reference herein in its entirety.

TECHNICAL FIELD

The present disclosure relates to an electronic device, and more particularly, to a memory controller for partially performing a memory built-in self-test (MBIST) on a mirror memory module in a system running state, an operation method thereof, a memory device, and a memory system.

DISCUSSION OF RELATED ART

Semiconductor memories are widely used for data storage in various types of electronic devices, including computers, wireless communication devices, cameras, and digital displays. These memories store data by programming different states within the semiconductor memories. To retrieve the stored data, at least one of the programmed states of a semiconductor memory is read or detected. In order to store data, components of these devices are used to record or program states of the semiconductor memories.

There are various types of semiconductor memories, including volatile memory such as dynamic random access memory (DRAM). Volatile memory, like DRAM, loses its stored state when disconnected from a power source. In addition, states of semiconductor memories may deteriorate over time, which can result in unrecoverable memory errors and other issues. Semiconductor chips, such as DRAM, are more prone to generate errors in manufacturing processes as micro-processes advance. Even if errors go undetected in initial test phases, they may still occur during chip operation.

The demand for high-capacity DRAM has increased due to the need for stable and fast real-time processing of massive data. However, the performance quality of DRAM can degrade over time. To address this, memory systems incorporate reliability, availability and serviceability (RAS) functions for DRAM. Accordingly, some memory systems may include memory modules for data storage and mirror memory modules that store the same data as the memory modules. Additionally, a memory built-in self-test (MBIST) is performed on these memory systems for testing hardware single-bit defects and/or multi-bit defects in DRAM. Furthermore, a memory built-in self-test post package repair (mPPR) for repairing defective rows may be performed.

However, the execution of MBIST and/or mPPR on memory systems can be time consuming. In addition, a DRAM normal operation may not be performed until the MBIST and/or mPPR are completed. Therefore, there is a need for a method that can enhance the utilization of an MBIST and/or mPPR and improve DRAM RAS functions, by reducing the time required to perform the MBIST and/or mPPR.

SUMMARY

Embodiments of the present disclosure provide a memory controller for partially performing a memory built-in self-test (MBIST) on a mirror memory module in a system running state, an operation method thereof, a memory device, and a memory system.

According to an embodiment of the present disclosure, there is provided a memory system including: a memory module including a plurality of memory chips; a mirror memory module including a plurality of mirror memory chips corresponding to the plurality of memory chips, a first mirror memory chip of the plurality of mirror memory chips being storing same data as a first memory chip of the plurality of memory chips; and a memory controller configured to, in a system running state in which an operation according to a request of a user is capable of being performed after the memory system is booted, provide the memory module with a command for instructing a normal operation to be performed and provide the mirror memory module with a command for instructing a memory built-in self-test (MBIST) to be performed.

According to an embodiment of the present disclosure, there is provided an operation method of a memory controller configured to communicate with a memory module and a mirror memory module, the operation method including: executing a mirroring mode in a system running state, the mirroring mode being executed to equally store, in the mirror memory module, data stored in the memory module; and after the mirroring mode is released, providing the mirror memory module with a command for instructing an MBIST to be performed.

According to an embodiment of the present disclosure, there is provided a memory device including: a memory cell array including a plurality of memory cells and a plurality of redundancy memory cells; a mode register group configured to store a flag bit value that indicates whether or not to perform an MBIST on some memory cells from among the plurality of memory cells, and the mode register group is further configured to store at least some bit values from among bit values of physical addresses of memory cells on which the MBIST is performed; an MBIST circuit configured to perform the MBIST on the some memory cells; and a repair circuit configured to perform a repair operation of replacing a defective memory cell detected via a test result of the MBIST with a redundancy memory cell.

According to an embodiment of the present disclosure, there is provided a memory controller configured to communicate with a memory module and a mirror memory module for equally storing data stored in the memory module, the memory controller including: a page offline detector configured to detect an operating system address corresponding to data having an error occurring therein when the error occurs in the data provided from the memory module; an address decoder configured to decode the operating system address into a physical address of the mirror memory module; an address register configured to store a page offline address including at least some bit values from among bit values of the physical address; and a command generator configured to output, to the mirror memory module, a first mode register write command for writing, into a first mode register, a bit value of a flag signal that indicates whether or not to perform an MBIST on memory cells having the page offline address, and a second mode register write command for writing the page offline address into a second mode register.

BRIEF DESCRIPTION OF THE DRAWINGS

Embodiments of the present disclosure will be more clearly understood from the following detailed description taken in conjunction with the accompanying drawings in which:

FIG. 16 is a diagram illustrating a mode register according to the JEDEC specification;

DETAILED DESCRIPTION OF THE EMBODIMENTS

Hereinafter, embodiments of the present disclosure will be described in detail with reference to the accompanying drawings.

Figure 1:
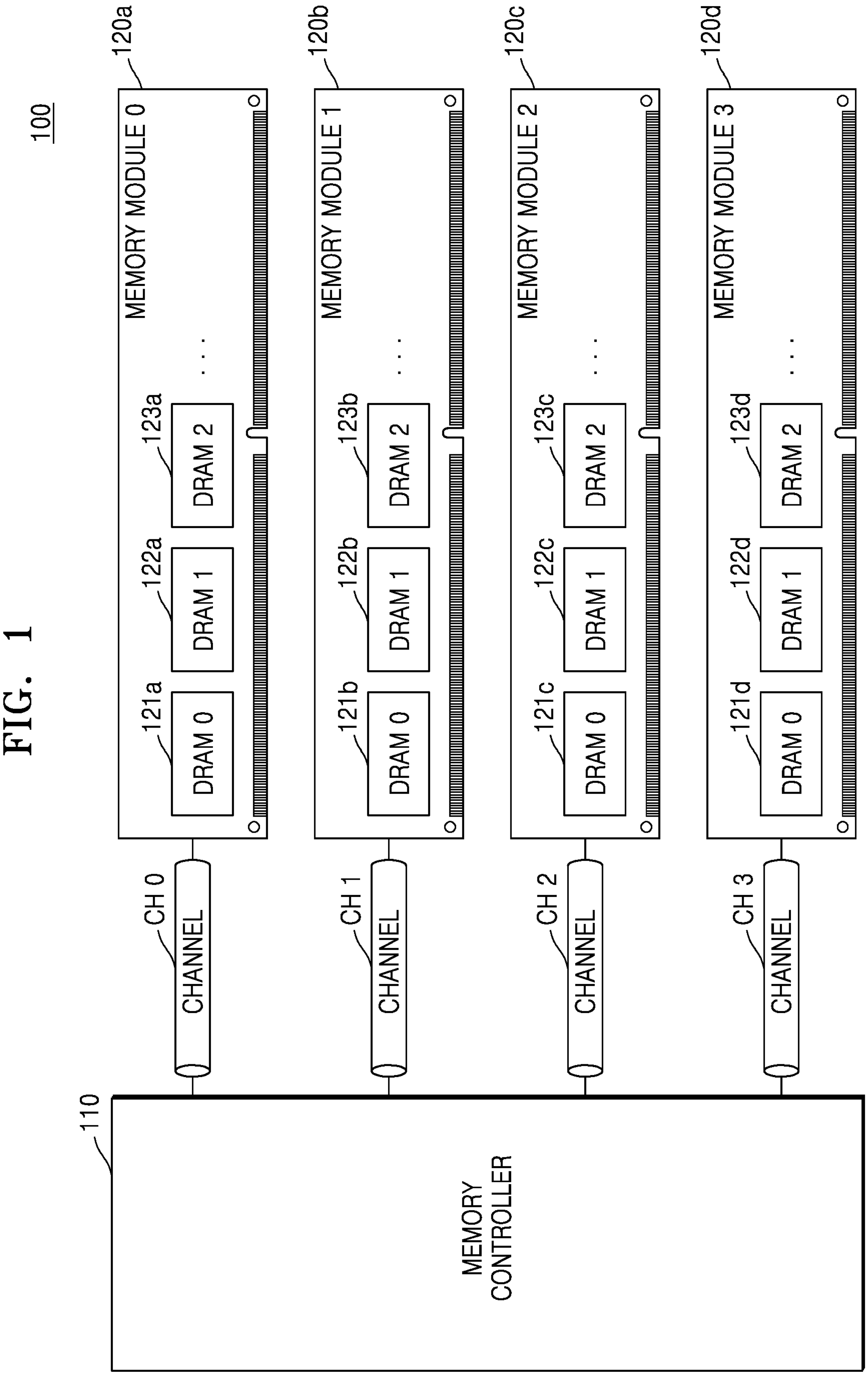
FIG. 1 is a block diagram illustrating a memory system according to embodiments of the present disclosure.

FIG. 1 is a block diagram illustrating a memory system according to embodiments of the present disclosure.

Referring to FIG. 1, a memory system 100 may be included in a computing system, such as a server. However, the memory system 100 is not limited thereto and may also be included in a computing apparatus, such as a personal computer, a notebook computer, a portable communication terminal, and a smartphone.

After booted (or powered up), the memory system 100 may set parameters related to an operation of the memory system 100 during an initialization period. For example, the memory system 100 may set whether or not to support a mirroring mode. In other words, the memory system 100 can provide an option to enable or disable the mirroring mode. The mirroring mode may be a mode in which data to be stored in one device (e.g., a memory module) is simultaneously stored in another device. In other words, the mirroring mode may be a mode in which the same data is simultaneously recorded (stored) in two or more storage devices by duplexing a storage device. Due to the mirroring mode, even when one of the storage devices is broken or damaged, the memory system 100 may continue to process a task without loss of data.

The memory system 100 may have a system running state after initialization. In other words, the memory system 100 enters a system running state after initialization. The system running state may be a state in which an operation according to a request of a user using the memory system 100 may be performed.

The memory system 100 may include a memory controller 110 and a plurality of memory modules (e.g., a memory module 0 120*a*, a memory module 1 120*b*, a memory module 2 120*c*, and a memory module 3 120*d*).

The memory controller 110 may be a host for performing a normal computer operation, and may control the overall operation of each of the memory modules (e.g., the memory module 0 120*a*, the memory module 1 120*b*, the memory module 2 120*c*, and the memory module 3 120*d*). The memory controller 110 may be, for example, a portion of components included in a computing apparatus, such as a server computer.

In the system running state, the memory controller 110 may control at least one of the plurality of memory modules (e.g., the memory module 0 120*a*, the memory module 1 120*b*, the memory module 2 120*c*, and the memory module 3 120*d*) to perform a normal operation. Here, the normal operation may include, for example, a read operation, a write operation, a refresh operation, or the like. Accordingly, the memory controller 110 may issue a command for instructing the normal operation to be performed. Here, the command may be integrated into a command/address signal. The command may include, for example, an active command, a pre-charge command, a read command, a write command, a refresh command, a mode register read command, a mode register write command, or the like.

In some embodiments, after the memory system 100 is booted (or powered up), the memory controller 110 may issue, to the plurality of memory modules (e.g., the memory module 0 120*a*, the memory module 1 120*b*, the memory module 2 120*c*, and the memory module 3 120*d*), a command for instructing a memory built-in self-test (MBIST) to be performed on the plurality of memory modules (e.g., the memory module 0 120*a*, the memory module 1 120*b*, the memory module 2 120*c*, and the memory module 3 120*d*). In addition, according to a test result of the MBIST, the memory controller 110 may issue, to the plurality of memory modules (e.g., the memory module 0 120*a*, the memory module 1 120*b*, the memory module 2 120*c*, and the memory module 3 120*d*), a command for instructing an MBIST post package repair (mPPR) to be performed on the plurality of memory modules (e.g., the memory module 0 120*a*, the memory module 1 120*b*, the memory module 2 120*c*, and the memory module 3 120*d*).

In some embodiments, after the memory system 100 is booted (or powered up), the memory controller 110 may issue a command for instructing an MBIST to be performed on a memory cell row having a physical address (e.g., a row address) of the same location for each of a plurality of memory chips included in each memory module. The memory cell row may be memory cells connected to the same word line, from among a plurality of memory cells included in a memory chip.

In some embodiments, after the memory system 100 is booted (or powered up), the memory controller 110 may issue a command for instructing an MBIST to be performed on a memory cell row corresponding to a physical address (e.g., a row address) for the same location of each of a plurality of memory chips included in each memory module, and, according to a test result of the MBIST, may issue a command for instructing an mPPR to be performed.

In some embodiments, after the memory system 100 is booted (or powered up), the memory controller 110 may issue a command for instructing an MBIST to be performed on a memory cell row having a row address of any one of a plurality of memory chips included in any memory module, and, according to a test result of the MBIST, may issue a command for instructing an mPPR to be performed.

In some embodiments, the memory controller 110 may execute, in the system running state, the mirroring mode set at the time of booting the memory system 100. Here, executing the mirroring mode may be referred to as entering the mirroring mode. An embodiment of the mirroring mode is described below with reference to FIGS. 2 to 4.

The memory controller 110 may communicate with the plurality of memory modules (e.g., the memory module 0 120*a*, the memory module 1 120*b*, the memory module 2 120*c*, and the memory module 3 120*d*) via channels. For example, the memory controller 110 may communicate with the memory module 0 120*a* via a channel CH 0. The memory controller 110 may communicate with the memory module 1 120*b* via a channel CHI. The memory controller 110 may communicate with the memory module 2 120*c* via a channel CH2. The memory controller 110 may communicate with the memory module 3 120*d* via a channel CH3.

Each of the plurality of memory modules (e.g., the memory module 0 120*a*, the memory module 1 120*b*, the memory module 2 120*c*, and the memory module 3 120*d*) may be implemented as an unbuffered dual in-line memory module (UDIMM), a registered DIMM (RDIMM), a load reduced DIMM (LRDIMM), a fully buffered DIMM (FB-DIMM), a small outline DIMM (SODIMM), or the like.

Each of the plurality of memory modules (e.g., the memory module 0 120*a*, the memory module 1 120*b*, the memory module 2 120*c*, and the memory module 3 120*d*) may include a plurality of memory chips. For example, the memory module 0 120*a* may include a plurality of memory chips (e.g., a memory chip 0 121*a*, a memory chip 1 122*a*, and a memory chip 123*a*). The memory module 1 120*b* may include a plurality of memory chips (e.g., a memory chip 0 121*b*, a memory chip 1 122*b*, and a memory chip 2 123*b*). The memory module 2 120*c* may include a plurality of memory chips (e.g., a memory chip 0 121*c*, a memory chip 1 122*c*, and a memory chip 2 123*c*). The memory module 3 120*d* may include a plurality of memory chips (e.g., a memory chip 0 121*d*, a memory chip 1 122*d*, and a memory chip 2 123*d*).

Each of a plurality of memory chips included in each memory module may be a volatile memory, such as synchronous dynamic random access memory (SDRAM), double data rate SDRAM (DDR SDRAM), low power double data rate SDRAM (LPDDR SDRAM), graphics double data rate SDRAM (GDDR SDRAM), DDR2 SDRAM, DDR3 SDRAM, DDR4 SDRAM, or DDR5 SDRAM.

In FIG. 1, the number of the plurality of memory modules (e.g., the memory module 0 120*a*, the memory module 1 120*b*, the memory module 2 120*c*, and the memory module 3 120*d*) is four, but is only an example, and thus, the number of memory modules is not limited to that illustrated in FIG. 1.

When the mirroring mode is entered, from among the plurality of memory modules (e.g., the memory module 0 120*a*, the memory module 1 120*b*, the memory module 2 120*c*, and the memory module 3 120*d*), at least two memory modules may be mirrored with each other. For example, from among the plurality of memory modules (e.g., the memory module 0 120*a*, the memory module 1 120*b*, the memory module 2 120*c*, and the memory module 3 120*d*), the memory module 0 120*a* and the memory module 1 120*b* may be mirrored with each other, and the memory module 2 120*c* and the memory module 3 120*d* may be mirrored with each other. However, embodiments are not limited thereto, and three or more memory modules may be mirrored with one another. In addition, the memory module 0 120*a* and the memory module 2 120*c* may be mirrored with each other, and the memory module 1 120*b* and the memory module 3 120*d* may be mirrored with each other.

From among two memory modules that are mirrored with each other, any one memory module may be referred to as a mirror memory module, and the other memory module may be referred to as a memory module, a master memory module, or an original memory module. For example, when the memory module 0 120*a* and the memory module 1 120*b* are mirrored with each other, the memory module 0 120*a* may be a mirror memory module, the memory module 1 120*b* may be a master memory module, or the memory module 0 120*a* may be a master memory module, and the memory module 1 120*b* may be a mirror memory module. A channel connected between the memory controller 110 and a mirror memory module may be referred to as a mirror channel or a mirroring channel, and a channel connected between the memory controller 110 and a memory module (or a master memory module) may be referred to as a master channel, an original channel, or the like. For example, when the memory module 0 120*a* is a mirror memory module and the memory module 1 120*b* is a master memory module, the channel CH 0 may be a mirror channel and the channel CH 1 may be a master channel.

Memory chips having the same number between mirrored memory modules may be mirrored with each other. For example, when the memory module 0 120*a* and the memory module 1 120*b* are mirrored with each other, the memory chip 0 121*a* and the memory chip 0 121*b* may be mirrored with each other, the memory chip 1 122*a* and the memory chip 1 122*b* may be mirrored with each other, and the memory chip 2 123*a* and the memory chip 2 123*b* may be mirrored with each other.

From among two memory chips that are mirrored with each other, any one memory chip may be referred to as a mirror memory chip or a mirroring memory chip, and the other memory chip may be referred to as a memory chip, a master memory chip, or an original memory chip. For example, the memory chip 0 121*a* may be a mirror memory chip, and the memory chip 0 121*b* may be a master memory chip (or an original memory chip), or the memory chip 0 121*a* may be a master memory chip, and the memory chip 0 121*b* may be a mirror memory chip.

In some embodiments, in a system running state, the memory controller 110 may provide a memory module with a command for instructing a normal operation to be performed. In addition, in the system running state, the memory controller 110 may provide a memory module a command for instructing an MBIST to be performed.

According to the above description, in a system running state, the reliability of a memory module may be improved by performing a normal operation on the memory module and at the same time, partially performing an MBIST and an mPPR on a mirror memory module.

According to the above description, an MBIST and an mPPR may be performed on a mirror memory module without stopping an operation of a memory system, and thus, the time taken to perform the MBIST and mPPR in the memory system may be reduced.

Figure 2:
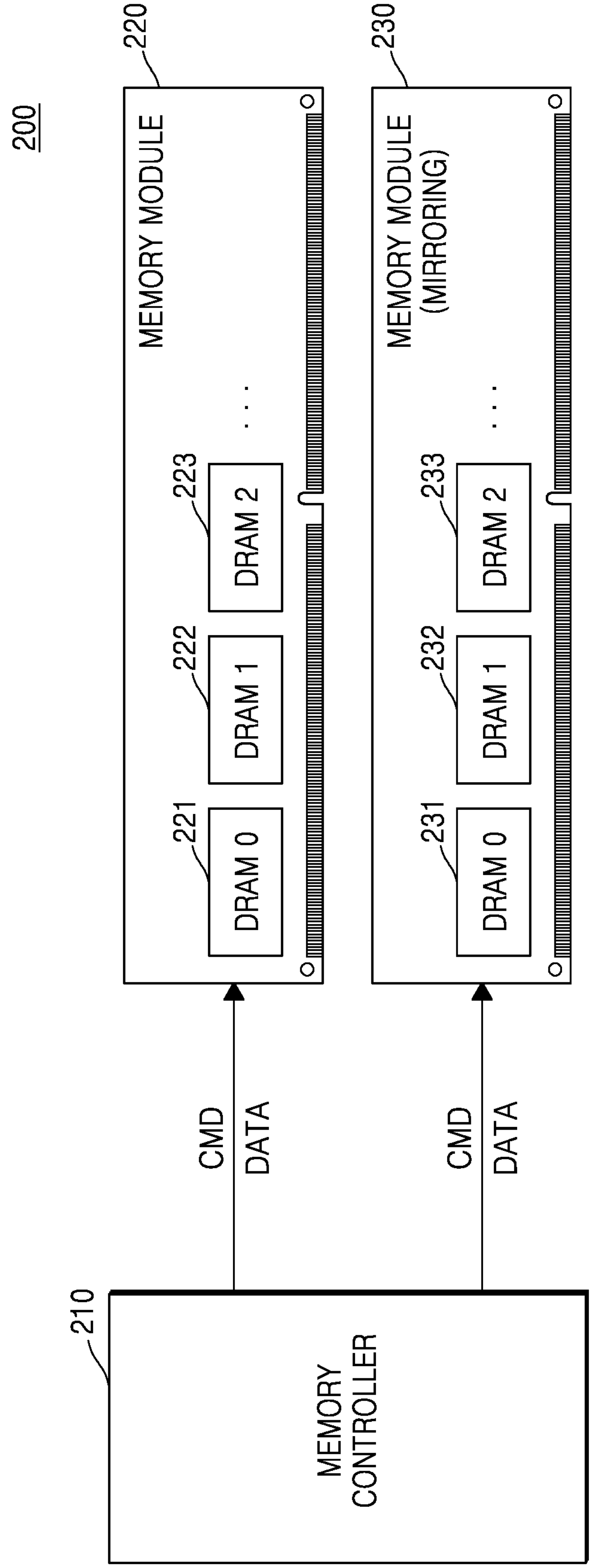
FIG. 2 is a block diagram illustrating a write operation in a mirroring mode, according to embodiments of the present disclosure.

FIG. 2 is a block diagram illustrating a write operation in a mirroring mode, according to embodiments of the present disclosure.

Referring to FIG. 2, a memory system 200 may include a memory controller 210 and memory modules 220 and 230. The memory system 200 may correspond to the memory system 100 illustrated in FIG. 1. The memory modules 220 and 230 may be some of the plurality of memory modules (e.g., the memory module 0 120*a*, the memory module 1 120*b*, the memory module 2 120*c*, and the memory module 3 120*d*) illustrated in FIG. 1. A mirroring mode may be executed in the memory system 200. Here, the memory modules 220 and 230 may be mirrored with each other. The memory module 220 may be a master memory module, and the memory module 230 may be a mirror memory module.

The memory module 220 may include a plurality of memory chips 221, 222, and 223.

The memory module 230 may include a plurality of memory chips 231, 232, and 233. The memory module 230 may correspond to the mirror memory module, and thus, the plurality of memory chips 231, 232, and 233 may be a plurality of mirror memory chips mirrored to the plurality of memory chips 221, 222, and 223.

In some embodiments, the memory controller 210 may execute the mirroring mode in a system running state. In addition, in mirroring mode, the memory controller 210 may sequentially provide a command CMD for simultaneously storing data DATA in the memory modules 220 and 230, and the data DATA. For example, the memory controller 210 may provide the memory module 220 with a write command for storing the data DATA in a target memory chip from among the plurality of memory chips 221, 222, and 223. Here, the write command to be provided to the memory module 220 may include a physical address of the target memory chip. At the same time, the memory controller 210 may provide the memory module 230 with a write command for storing the data DATA in a target mirror memory chip corresponding to the target memory chip, from among the plurality of memory chips 231, 232, and 233. Here, the write command to be provided to the memory module 230 may include a physical address of the target mirror memory chip. For example, the target memory chip may be the memory chip 221, and the target mirror memory chip may be the memory chip 231. However, embodiments are not limited thereto. As another example, the target memory chip may be the memory chip 222, and the target mirror memory chip may be the memory chip 232.

Figure 3:
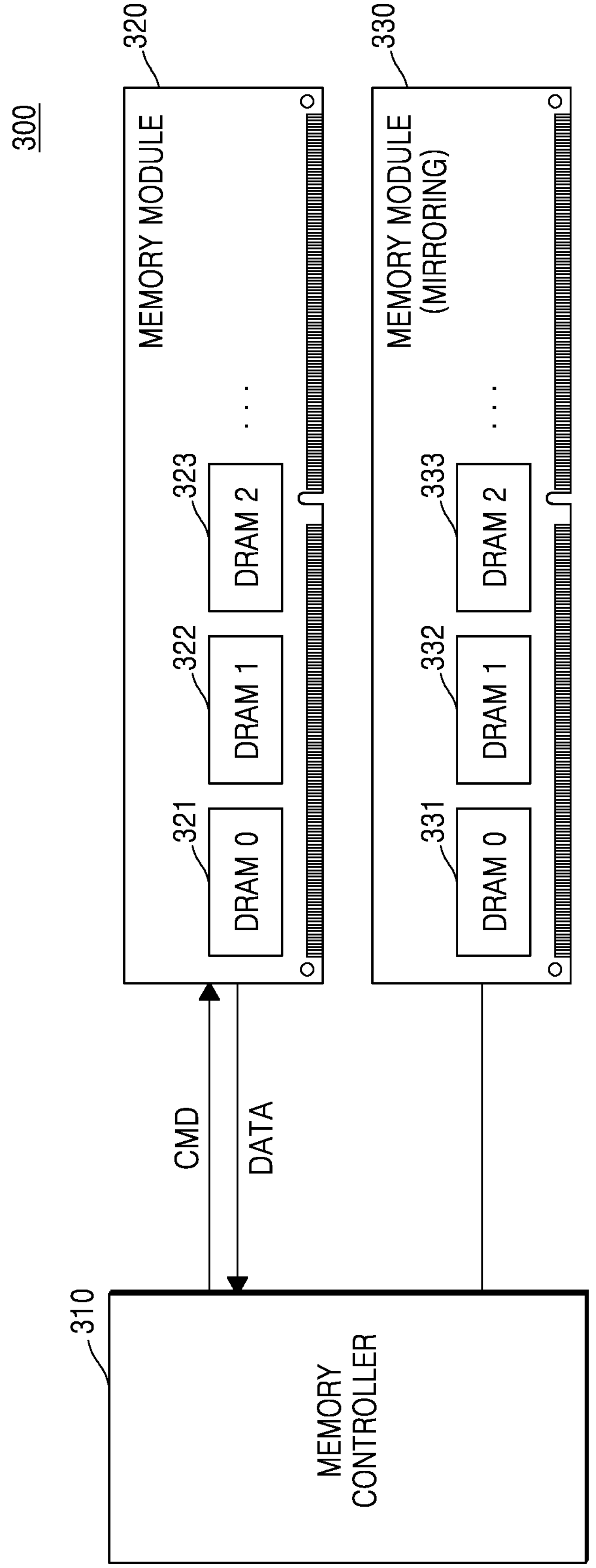
FIGS. 3 and 4 are block diagrams illustrating a read operation in a mirroring mode, according to embodiments of the present disclosure.
Figure 4:
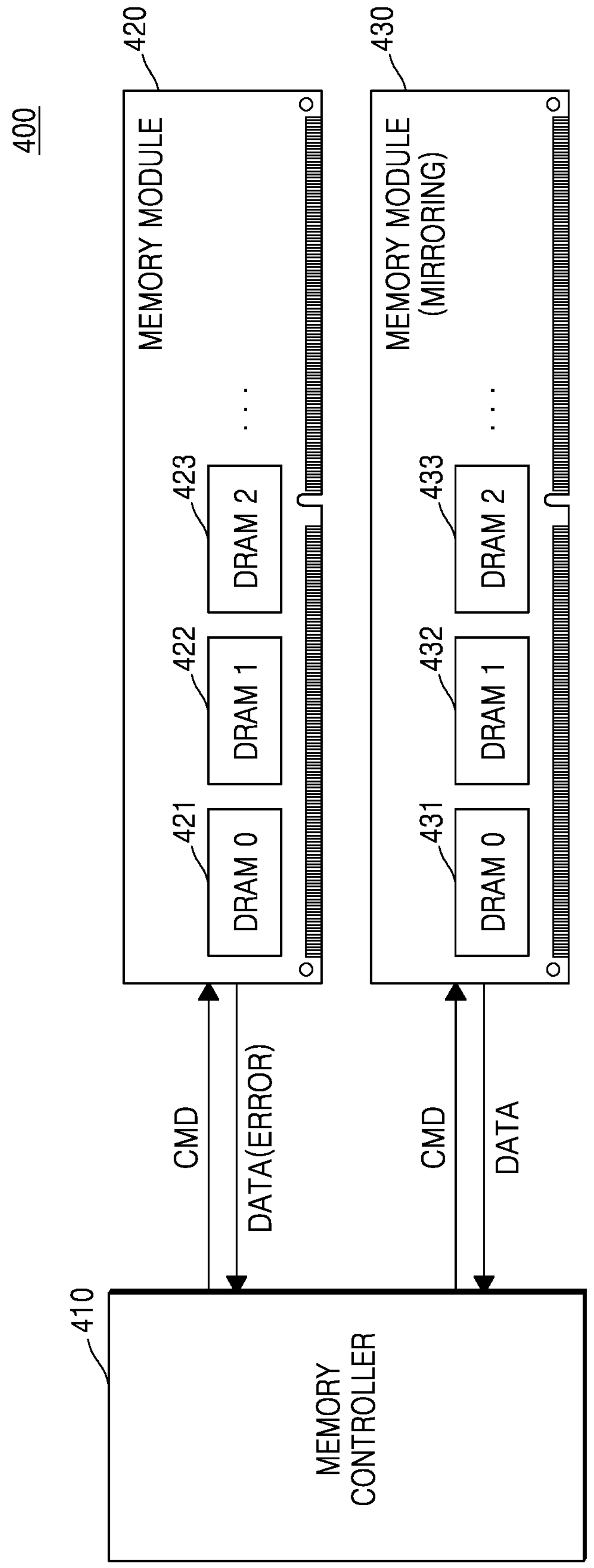

FIGS. 3 and 4 are block diagrams illustrating a read operation in a mirroring mode, according to embodiments of the present disclosure.

Referring to FIGS. 3 and 4, a memory system 300 and a memory system 400 may respectively correspond to the memory system 100 of FIG. 1 and the memory system 200 of FIG. 2. Memory modules 320 and 330 and memory modules 420 and 430 may be some of the plurality of memory modules (e.g., the memory module 0 120*a*, the memory module 1 120*b*, the memory module 2 120*c*, and the memory module 3 120*d*) illustrated in FIG. 1, and may be mirrored with each other.

In FIG. 3, the memory module 320 may be a master memory module, and the memory module 330 may be a mirror memory module. In addition, in FIG. 4, the memory module 420 may be a master memory module, and the memory module 430 may be a mirror memory module.

Referring to FIG. 3, a memory controller 310 may execute a mirroring mode. In addition, in the mirroring mode, the memory controller 310 may provide a command CMD for reading data DATA stored in the memory module 320. For example, the memory controller 310 may provide the memory module 320 with a read command for reading the data DATA stored in a target memory chip (e.g., the memory chip 321) from among a plurality of memory chips 321, 322, and 323 included in the memory module 320. Here, the memory module 330 corresponding to the mirror memory module may wait. The memory module 330 includes a plurality of memory chips 331, 332, and 333.

Referring to FIG. 4, an error ERROR may occur in data DATA read from a target memory chip (e.g., a memory chip 421) included in the memory module 420. The memory module 420 includes a plurality of memory chips 421, 422, and 423. The error ERROR may be correctable or uncorrectable. According to a state of the error ERROR occurring in the read data DATA, a memory controller 410 may provide the memory module 430 with a read command for reading the data DATA stored in a target mirror memory chip corresponding to a mirror memory chip, from among a plurality of memory chips 431, 432, and 433. Here, the state of the error ERROR may be, for example, a state in which an uncorrectable error is included in the data DATA output from the memory module 420. In another example, the state of the error ERROR may be a state in which an error correction rate for correcting a correctable error in the data DATA output from the memory module 420 is relatively high. As described above, when an uncorrectable error occurs or a relatively high error correction rate occurs, the memory controller 410 may read the data DATA from a target mirror memory chip, which stores the same data as the data DATA stored in a target memory chip, and thus, a data read speed may be improved and the reliability of data or a memory chip may be improved.

In some embodiments, when the error ERROR occurs in the data DATA read from a target memory chip, the memory controller 410 may store a particular physical address of a target mirror memory chip corresponding to a particular physical address of the target memory chip that stores the data DATA.

Figure 5:
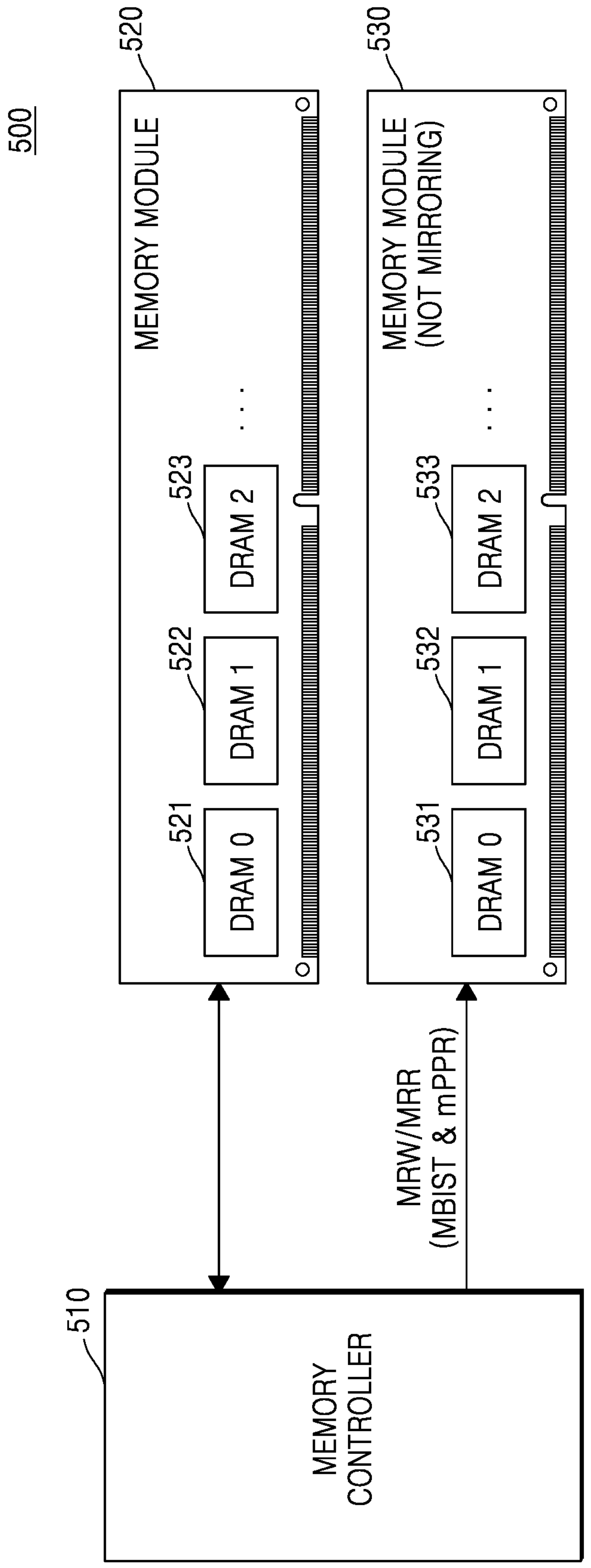
FIG. 5 is a block diagram illustrating a memory built-in self-test (MBIST) and an MBIST post package repair (mPPR) according to embodiments of the present disclosure.

FIG. 5 is a block diagram illustrating an MBIST and an mPPR according to embodiments of the present disclosure.

Referring to FIG. 5, a memory system 500 may correspond to the memory systems 100, 200, 300, and 400 described above with reference to FIGS. 1 to 4. Memory modules 520 and 530 may be some of the plurality of memory modules (e.g., the memory module 0 120*a*, the memory module 1 120*b*, the memory module 2 120*c*, and the memory module 3 120*d*) illustrated in FIG. 1. The memory module 520 includes a plurality of memory chips 521, 522, and 523.

In some embodiments, in a system running state, a memory controller 510 may release a mirroring mode described with reference to FIGS. 2 to 4. When the mirroring mode is released, the memory controller 510 may provide the memory module 530 with a command MRW/MRR for instructing an MBIST to be performed.

The MBIST may meet the DDR5 specification determined by the Joint Electron Device Engineering Council (JEDEC). Accordingly, the memory module 530 may perform an MBIST defined in the DDR5 specification of the JEDEC. An embodiment of the MBIST is described below with reference to FIG. 15.

In some embodiments, the MBIST may be performed on a plurality of memory chips 531, 532, and 533 included in the memory module 530. However, embodiments are not limited thereto, and in some embodiments, the MBIST may be performed on a memory cell row having a particular physical address of a target mirror memory chip, which is stored in the memory controller 510.

In some embodiments, when the mirroring mode is released, according to a test result of the MBIST, the memory controller 510 may provide the memory module 530 with a command MRW/MRR for instructing an mPPR to be performed.

The mPPR may meet the DDR5 specification of the JEDEC. Accordingly, the memory module 530 may perform the mPPR defined in the DDR5 specification of the JEDEC. An embodiment of the mPPR is described below with reference to FIG. 15.

When the mirroring mode is released, the memory controller 510 may also provide the memory module 520 with a command for instructing a normal operation. Alternatively, when the mirroring mode is released, the memory module 520 may wait. In other words, a state of the memory module 520 may be an idle state.

Figure 6:
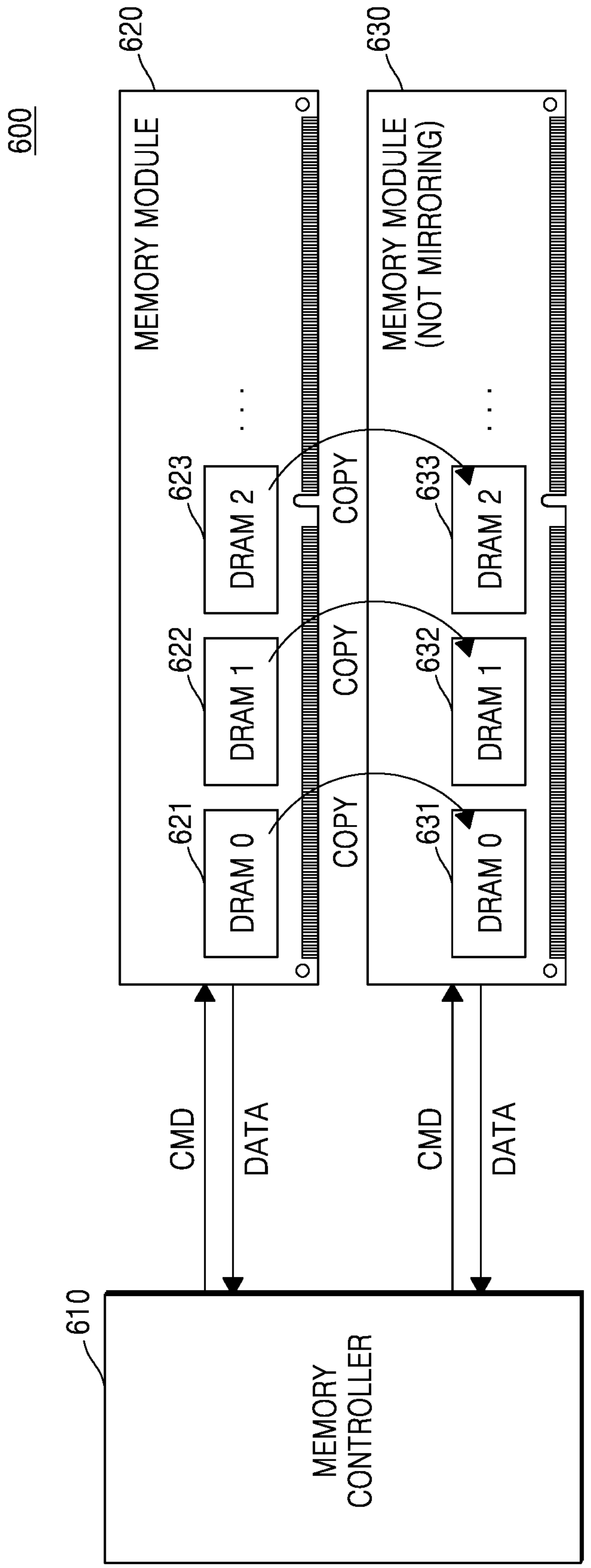
FIG. 6 is a block diagram illustrating a copy operation according to embodiments of the present disclosure.

FIG. 6 is a block diagram illustrating a copy operation according to embodiments of the present disclosure.

Referring to FIG. 6, a memory system 600 may correspond to the memory systems 100 to 500 described above with reference to FIGS. 1 to 5. Memory modules 620 and 630 may be some of the plurality of memory modules (e.g., the memory module 0 120*a*, the memory module 1 120*b*, the memory module 2 120*c*, and the memory module 3 120*d*) illustrated in FIG. 1.

After a mirroring mode is released and an MBIST is completed (or after the MBIST and an mPPR are completed), a memory controller 610 may copy all of data DATA, which is stored in the memory module 620 operating as a master memory module, into the memory module 630 operating as a mirror memory module. For example, the memory controller 610 may issue, to the memory module 620, a command CMD for reading the data DATA stored in the memory module 620. Here, the command CMD for reading the data DATA may be a read command, and may include a physical address of each of a plurality of memory chips 621, 622, and 623 included in the memory module 620. For example, the memory controller 610 may provide the memory module 620 with a read command for reading the data DATA stored in the plurality of memory chips 621, 622, and 623. Subsequently, the memory controller 610 may issue, to the memory module 630, a command CMD for writing the data DATA. Here, the command CMD for writing data DATA may be a write command, and may include a physical address of each of a plurality of memory chips 631, 632, and 633 included in the memory module 630. For example, the memory controller 610 may provide the memory module 630 with a write command for storing, in the plurality of memory chips 631, 632, and 633, the data DATA provided from the memory module 620.

As illustrated in FIG. 6, the data DATA stored in the memory chip 621 may be copied into the memory chip 631, the data DATA stored in the memory chip 622 may be copied into the memory chip 632, and the data DATA stored in the memory chip 623 may be copied into the memory chip 633.

After all the data DATA stored in the memory module 620 operating as the master memory module is copied into the memory module 630 operating as the mirror memory module, the memory controller 610 may re-execute a mirroring mode. In other words, the mirroring mode may be re-entered after the data DATA is copied.

After the mirroring mode is re-entered, an operation of swapping a device (e.g., a memory module) operating as a mirror memory module and a target operating as a master memory module with each other may be performed. For example, after the mirroring mode is re-entered, the memory module 620 may operate as a mirror memory module and the memory module 630 may operate as a master memory module. Here, when the mirroring mode is released, as described above with reference to FIG. 5, an MBIST may be performed on the memory module 620 and an mPPR may be additionally performed on the memory module 620, according to a test result of the MBIST.

As described above, in a system running state, an operation of copying data may be performed while partially performing an MBIST and an mPPR on a mirror memory module. Therefore, the time taken to perform the MBIST and mPPR in a memory system may be reduced, and the reliability of the memory module may be improved.

Figure 7:
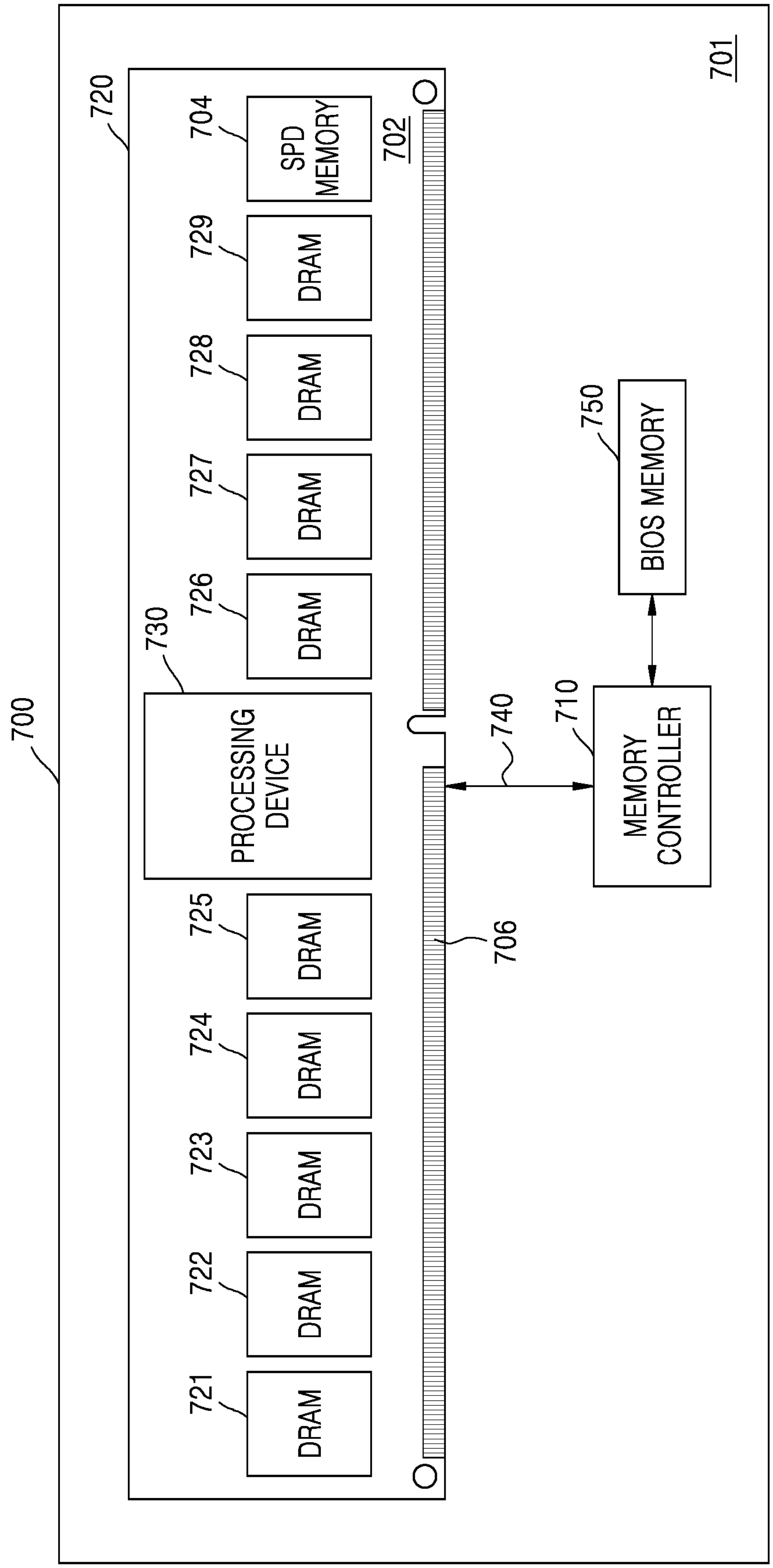
FIG. 7 is a block diagram illustrating a computing system according to embodiments of the present disclosure.

FIG. 7 is a block diagram illustrating a computing system according to embodiments of the present disclosure.

Referring to FIG. 7, a computing system 700 may include a memory controller 710, a memory module 720, and a basic input/output system (BIOS) memory 750 that are mounted on a board 701. The memory controller 710 may be communicatively connected to the memory module 720 via a memory bus 740.

The memory controller 710 may operate as a functional block that performs common computer operations within the computing system 700. The memory controller 710 may correspond to a central processing unit (CPU), a digital signal processor (DSP), or an application processor (AP).

The memory controller 710 may be configured to execute one or more machine-executable instructions or pieces of software, firmware, or a combination thereof. The memory controller 710 may be connected to the BIOS memory 750 via various types of interfaces, such as a serial peripheral interface and a low pin count bus.

The BIOS memory 750 may store BIOS code for booting the computing system 700. The BIOS memory 750 may be implemented as a non-volatile memory device, such as flash memory. The BIOS code is POST code for detecting pieces of hardware of the computing system 700, such as the board 701, the memory module 720, a keyboard, and a disk drive, and identifying whether or not the pieces of hardware operate normally. The BIOS code may include a memory reference code (MRC) for initializing the memory module 720. The MRC may include various algorithms configured to enable the memory controller 710 to normally interoperate with the memory module 720.

Via the MRC executed by the memory controller 710, serial presence detect (SPD) data stored in an SPD memory device 704 of the memory module 720 may be read via the memory bus 740, and frequency, timing, running, detailed operation parameters, and the like for controlling the memory module 720 may be set by using the SPD data. The SPD data may include a type of the memory module 720, a type of a memory device included in the memory module 720, operation timing information, manufacturing information, a revision code, a serial number, and the like. The BIST and/or memory training of the memory module 720 may be performed by the MRC code.

The memory bus 740 may be implemented, between the memory controller 710 and connecting pins 706 of the memory module 720, as one channel including a plurality of signal lines, or a plurality of channels. The memory bus 740 may include command/address signal lines for transmitting a command/address and data lines for transmitting data.

The memory module 720 may be configured to perform a processing function, and may include a processing device 730, a plurality of memory devices 721, 722, 723, 724, 725, 726, 727, 728 and 729, and the SPD memory device 704 that are combined with a printed circuit board 702. For example, the memory module 720 may be implemented as an RDIMM, an LRDIMM, an FBDIMM, an SODIMM, or the like.

The processing device 730 may include a registered clock driver (RCD).

The memory devices 721 to 729 may write data or read data. For example, the memory devices 721 to 729 may be DRAM devices. However, the embodiments are not limited thereto, and the memory devices 721 to 729 may be any one of volatile memory devices, such as SDRAM, DDR SDRAM, LPDDR SDRAM, GDDR SDRAM, DDR2 SDRAM, DDR3 SDRAM, DDR4 SDRAM, and DDR5 SDRAM.

Figure 8:
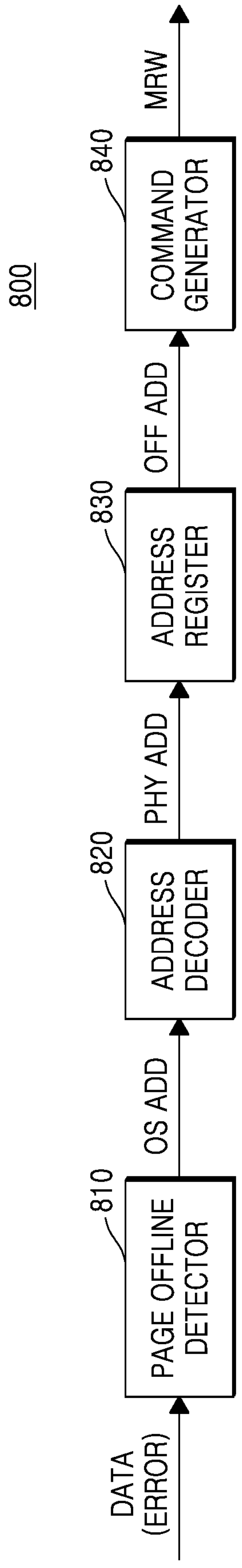
FIG. 8 is a block diagram illustrating an operation of detecting a particular physical address on which an MBIST is partially performed, according to embodiments of the present disclosure.

FIG. 8 is a block diagram illustrating an operation of detecting a particular physical address on which an MBIST is partially performed, according to embodiments of the present disclosure.

Referring to FIG. 8, a memory controller 800 may correspond to the memory controllers 310, 410, and 710 described above with reference to FIGS. 3, 4, and 7.

Referring to FIGS. 4 and 8, in some embodiments, the memory controller 800 may execute a mirroring mode. Also, in the mirroring mode, when an error ERROR occurs in data DATA provided from a memory module (e.g., the memory module 420 illustrated in FIG. 4), the memory controller 800 may provide a mirror memory module (e.g., the memory module 430 illustrated in FIG. 4) with a command for logging, into a mode register of a mirror memory chip, a physical address of the mirror memory chip (e.g., the memory chip 431 illustrated in FIG. 4) corresponding to a physical address of a memory chip (e.g., the memory chip 421 illustrated in FIG. 4) in which data is stored. The command for logging the physical address is provided to preemptively perform an MBIST and an mPPR on a target mirror memory chip when data stored in the target mirror memory chip needs to be read. A defective memory cell may be replaced with a redundancy memory cell by preemptively performing the MBIST and mPPR on the target mirror memory chip, and thus, the reliability of data stored in the target mirror memory chip may be guaranteed.

In an embodiment, the memory controller 800, which is an electronic circuit, may include a page offline detector 810, an address decoder 820, an address register 830 and a command generator 840.

A page offline may be an event in which a data error occurs in a master memory module or the probability of occurrence of a data error is relatively high. The memory controller 800 may recognize a memory cell row of a target memory chip that generates a page offline, preemptively perform an MBIST and an mPPR on a memory cell row of a target mirror memory chip corresponding thereto, and prevent, in advance, an error from occurring in data read from the target mirror memory chip.

When an error occurs in data DATA provided from a memory module (e.g., the memory module 420 illustrated in FIG. 4), the page offline detector 810 may detect an operating system address corresponding to the data DATA in which the error occurs. When the error occurs in the data DATA provided from the memory module (e.g., the memory module 420 illustrated in FIG. 4), the page offline detector 810 may recognize a physical address of a target memory chip in which the corresponding data DATA is stored. However, a position of a bit of the physical address of the target memory chip may be changed in the memory controller 800 due to a board design or the like. An address modified as described above may be referred to as an operating system address OS ADD. The operating system address OS ADD may be output from the page offline detector 810.

The address decoder 820 may decode the operating system address OS ADD into a particular physical address PHY ADD of a mirror memory module. Here, the particular physical address PHY ADD of the mirror memory module may include an address representing each of a channel, rank (or chip number), bank group, row, and column of the mirror memory module, to perform an MBIST and an mPPR on a memory cell row corresponding to the particular physical address PHY ADD of the mirror memory module. The address decoder 820 may output the particular physical address PHY ADD and provide it to the address register 830.

The address register 830 may store a page offline address OFF ADD including at least some of bit values of the particular physical address PHY ADD. The particular physical address PHY ADD of the mirror memory module may be written into a mode register of a memory chip as described below. However, in terms of limitations on the number and capacity of mode registers that are reserved for future use (RFU) in the DDR5 specification of the JEDEC, only some of the particular physical addresses PHY ADD of the mirror memory module may be stored in the mode register. In some embodiments, the page offline address OFF ADD may include bit values respectively representing the channel, rank (or chip number), bank group, bank, and row of the mirror memory module. In an embodiment, the bit value of the row included in the page offline address OFF ADD may be a higher bit value (e.g., a most significant bit (MSB)). The address register 830 may output the page offline address OFF ADD and provide it to the command generator 840.

In a mirroring mode, the command generator 840 may output a mode register write command MRW to the mirror memory module. In some embodiments, the mode register write command MRW may include a first mode register write command for writing a bit value of a flag signal into a first mode register and a second mode register write command for writing the page offline address OFF ADD (e.g., bit values of the page offline address OFF ADD) into at least one second mode register.

The flag signal may include bit values indicating whether or not to partially perform an MBIST on some memory cells (e.g., a memory cell row) included in at least one memory chip of the mirror memory module. Partially performing the MBIST may indicate performing the MBIST on some memory cell rows.

The first mode register may be, for example, a mode register 23 (e.g., MR23) defined in the DDR5 specification of the JEDEC. However, embodiments are not limited thereto.

The second mode register may be a mode register allocated to be RFU currently in the DDR5 specification of the JEDEC. A mode register 41 (e.g., MR41), a mode register 49

(e.g., MR49), and mode registers 70 to 102 (e.g., MR70 to MR102) are allocated to be RFU currently in the DDR5 specification of the JEDEC. Accordingly, the second mode register may be selected from the mode register 41 (e.g., MR41), the mode register 49 (e.g., MR49), and the mode registers 70 to 102 (e.g., MR70 to MR102).

In some embodiments, when the mirroring mode is released or a memory system is booted, the command generator 840 may provide the mirror memory module with a command (e.g., MRW/MRR) for instructing the MBIST to be performed. In addition, the command generator 840 may provide the mirror memory module with a command (e.g., MRW/MRR) for instructing the mPPR to be performed.

Figure 9:
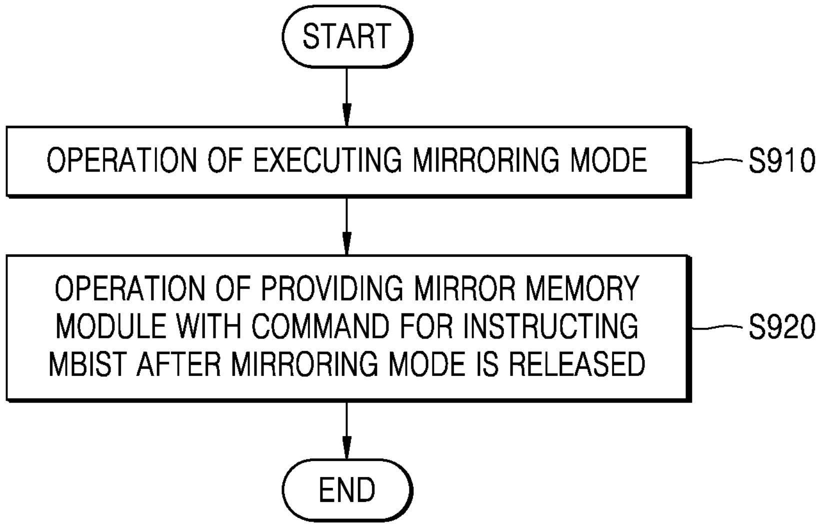
FIG. 9 is a flowchart illustrating an operation method of a memory controller according to embodiments of the present disclosure.

FIG. 9 is a flowchart illustrating an operation method of a memory controller according to embodiments of the present disclosure.

Referring to FIGS. 1 and 9, in operation S910, an operation of executing a mirroring mode is performed. For example, after the memory system 100 is booted, an operation of executing a mirroring mode in a system running state in which an operation according to a request of a user may be performed is performed. For example, the memory system 100 may be booted. After the booting operation, in an initialization operation, the memory controller 110 can put the memory system 100 in the mirroring mode. In addition, in the initialization operation, an MBIST and an mPPR may be performed on the plurality of memory modules (e.g., the memory module 0 120*a*, the memory module 1 120*b*, the memory module 2 120*c*, and the memory module 3 120*d*). In the system running state, the memory controller 110 may execute the mirroring mode.

In operation S920, after the mirroring mode is released, an operation of providing a mirror memory module with a command for instructing an MBIST is performed. For example, after the mirroring mode is released, the memory controller 110 may provide a command for instructing an MBIST to be performed on a memory module (e.g., the memory module 1 120*b* and/or the memory module 3 120*d*) operating as a mirror memory module.

According to the above description, the time taken to perform an MBIST and an mPPR may be reduced, and the reliability of a memory may be improved.

Figure 10:
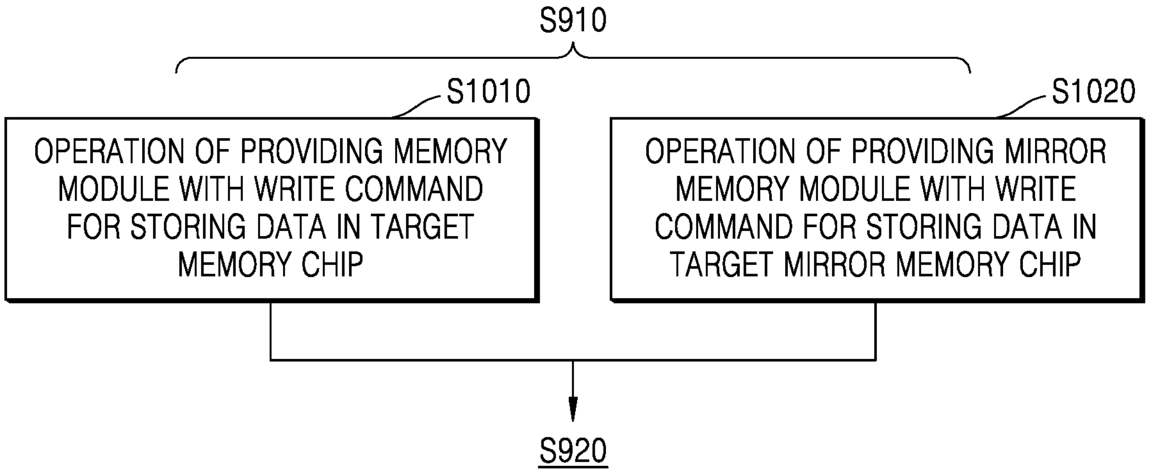
FIG. 10 is a flowchart illustrating a write operation included in operation S910 of FIG. 9.

FIG. 10 is a flowchart illustrating a write operation included in operation S910 of FIG. 9.

Referring to FIGS. 9 and 10, operation S910 may include operations S1010 and S1020. Operations S1010 and S1020 may be performed simultaneously.

In operation S1010, an operation of providing a memory module with a write command for storing data in a target memory chip is performed. Referring to FIG. 2, for example, the memory controller 210 may provide the memory module 220 with a write command for storing the data DATA in a target memory chip (e.g., the memory chip 222) from among the plurality of memory chips 221, 222, and 223 included in the memory module 220.

In operation S1020, an operation of providing a mirror memory module with a write command for storing data in a target mirror memory chip is performed. Referring to FIG. 2, the memory controller 210 may provide a mirror memory module with a write command for storing the data DATA in a target mirror memory chip (e.g., the memory chip 232) corresponding to a target memory chip (e.g., the memory chip 222), from among a plurality of mirror memory chips (e.g., the plurality of memory chips 231, 232, and 233) included in the mirror memory module (e.g., the memory module 230). In another example, the write command for storing the data DATA may be simultaneously provided to the memory chips 223 and 233 functioning as master and mirror memory chips, respectively.

Operations S1010 and S1020 are performed, and then operation S920 is performed.

Figure 11:
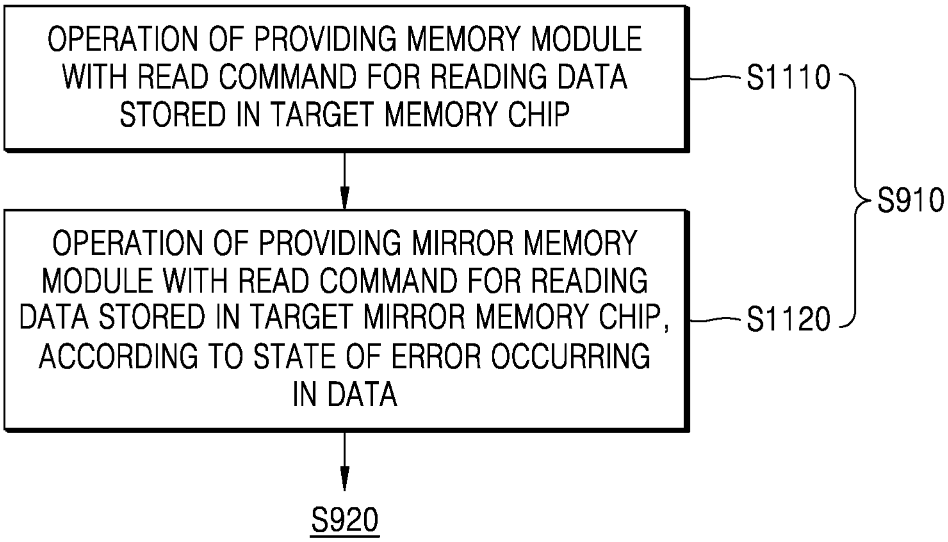
FIG. 11 is a flowchart illustrating a read operation included in operation S910 of FIG. 9.

FIG. 11 is a flowchart illustrating a read operation included in operation S910 of FIG. 9.

Referring to FIGS. 9 and 11, operation S910 may include operations S1110 and S1120. Operations S1110 and S1120 may be sequentially performed.

In operation S1110, an operation of providing a memory module with a read command for reading data stored in a target memory chip is performed. Referring to FIG. 3, for example, the memory controller 310 may provide the memory module 320 with a read command for reading the data DATA stored in a target memory chip (e.g., the memory chip 323) from among the plurality of memory chips 321, 322, and 323 included in the memory module 320.

In operation S1120, an operation of providing a mirror memory module with a read command for reading data stored in a target mirror memory chip, according to a state of an error occurring in the data is performed. Referring to FIG. 4, for example, when a state of the error ERROR occurring in the data DATA read from a target memory chip (e.g., the memory chip 423) is uncorrectable, the memory controller 410 may provide a mirror memory module with a read command for reading the data DATA stored in a target mirror memory chip (e.g., the memory chip 433) corresponding to the target memory chip (e.g., the memory chip 423), from among a plurality of mirror memory chips (e.g., the plurality of memory chips 431, 433, and 433) included in the mirror memory module (e.g., the memory module 430).

Figure 12:
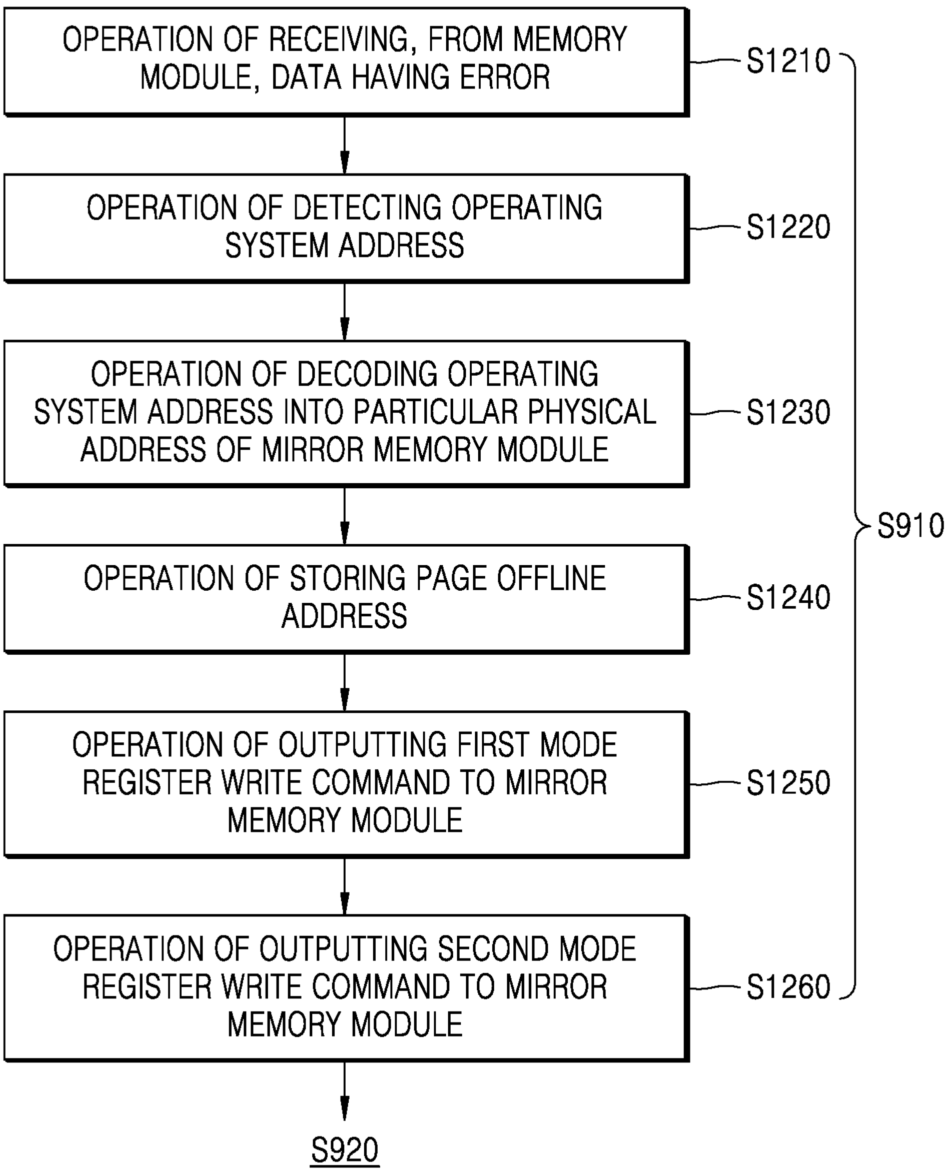
FIG. 12 is a flowchart illustrating an operation of detecting a particular physical address on which an MBIST is partially performed, which is included in operation S910 of FIG. 9.

FIG. 12 is a flowchart illustrating an operation of detecting a particular physical address on which an MBIST is partially performed, which is included in operation S910 of FIG. 9.

Referring to FIG. 12, operation S910 may include operation S1210, operation S1220, operation S1230, operation S1240, operation S1250, and operation S1260.

In operation S1210, an operation of receiving data having an error from a memory module is performed. Referring to FIG. 4, for example, the memory controller 410 may receive the data DATA including the error ERROR from the memory module 420.

In operation S1220, an operation of detecting an operating system address is performed. Referring to FIG. 8, for example, for the data DATA including the error ERROR, which is received from the memory module, the page offline detector 810 may detect the operating system address OS ADD corresponding to the data DATA including the error ERROR and output the operating system address OS ADD to the address decoder 820.

In operation S1230, an operation of decoding the operating system address into a particular physical address of a mirror memory module is performed. Referring to FIG. 8, for example, the address decoder 820 may decode the operating system address OS ADD into the particular physical address PHY ADD and output the particular physical address PHY ADD to the address register 830.

In operation S1240, an operation of storing a page offline address is performed. Referring to FIG. 8, for example, the page offline address OFF ADD including at least some of bit values of the particular physical address PHY ADD may be stored in the address register 830.

In operation S1250, an operation of outputting a first mode register write command to the mirror memory module is performed. For example, the command generator 840 may generate and output the first mode register write command. The first mode register write command may instruct a bit value of a flag signal to be written into a first mode register included in each mirror memory chip. The bit value of the flag signal may be used to notify whether or not to partially perform an MBIST on some memory cells.

In operation S1260, an operation of outputting a second mode register write command to the mirror memory module is performed. The second mode register write command may instruct the page offline address to be written into at least one second mode register included in each mirror memory chip. For example, the command generator 840 may generate and output the second mode register write command.

Figure 13:
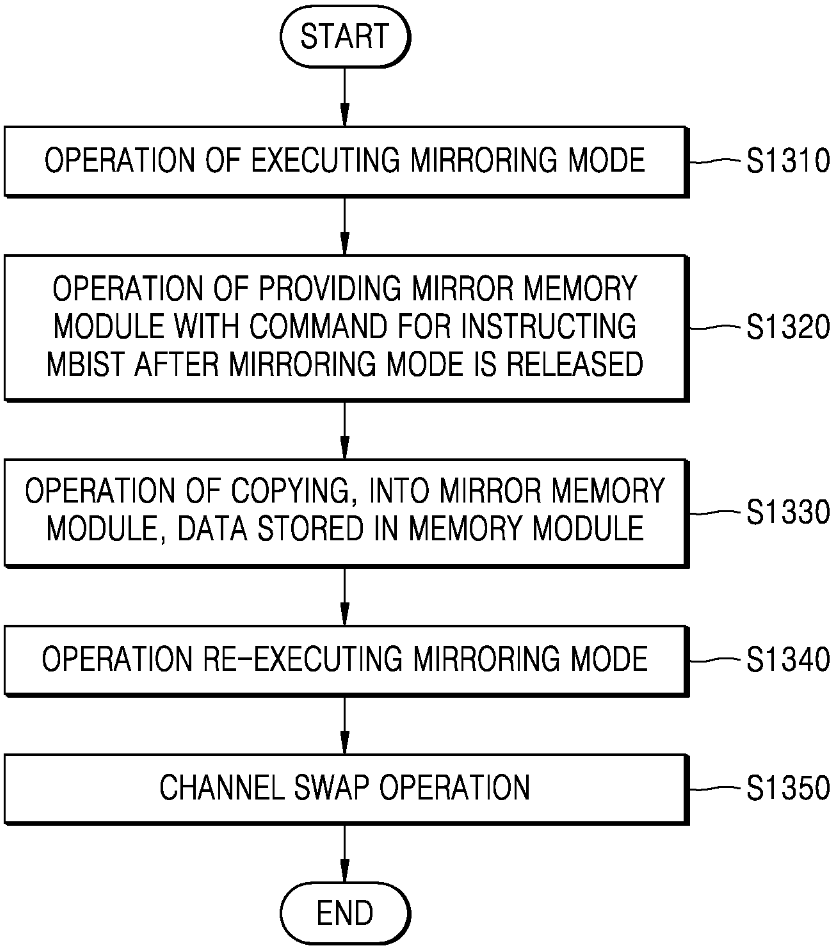
FIG. 13 is a flowchart illustrating an operation method of a memory controller according to embodiments of the present disclosure.

FIG. 13 is a flowchart illustrating an operation method of a memory controller according to embodiments of the present disclosure.

Referring to FIG. 13, the operation method of a memory controller may include operations S1310 to S1350.

Operations S1310 and S1320 are the same as operations S910 and S920.

In operation S1330, an operation of copying data stored in a memory module into a mirror memory module is performed. For example, operation S1330 may include an operation of providing a memory module with a read command for reading data stored in the memory module and an operation of providing a mirror memory module with a write command for storing data read from the memory module. An embodiment of operation S1330 is the same as described above with reference to FIG. 6.

In operation S1340, an operation of re-executing a mirroring mode is performed. In other words, after the operation of copying the data according to operation S1330 is performed, a released mirroring mode may be re-entered.

In operation S1350, a channel swap operation is performed. In other words, an operation of swapping the memory module and the mirror memory module with each other is performed. For example, in a system running state, a memory controller may swap channels with each other by changing a channel connected to a memory module to a mirror channel and changing a mirror channel connected to a mirror memory module to a master channel. Referring to FIG. 1, for example, during a first operation period, the memory module 0 120*a* may operate as a master memory module, and the memory module 1 120*b* may operate as a mirror memory module. After the first operation period, the memory controller 110 may change a status of the channel CH 0 from a master channel to a mirror channel, and may change a status of the channel CH 1 from a mirror channel to a master channel. In other words, the memory controller 110 may swap channels by changing statuses of the channel CHO and the channel CH1 with each other. When a channel swap occurs, the memory module 0 120*a* may operate as a mirror memory module and the memory module 1 120*b* may operate as a master memory module. When the mirroring mode is released after the channel swap operation is performed, an MBIST and an mPPR may be performed on a mirror memory module from among the swapped memory modules. Referring to FIG. 1, for example, when the mirroring mode is released, the memory controller 110 may output, via the channel CH 0, a command for instructing the MBIST to be performed. In addition, the memory module 0 120*a* operating as a mirror memory module may perform the MBIST. According to a test result of the MBIST, the memory controller 110 may also output, via the channel CH 0, a command for instructing the mPPR to be performed, and the memory module 0 120*a* may perform the mPPR.

In some embodiments, operation S1350 is not necessarily performed. In other words, operation S1350 may be selectively performed.

Figure 14:
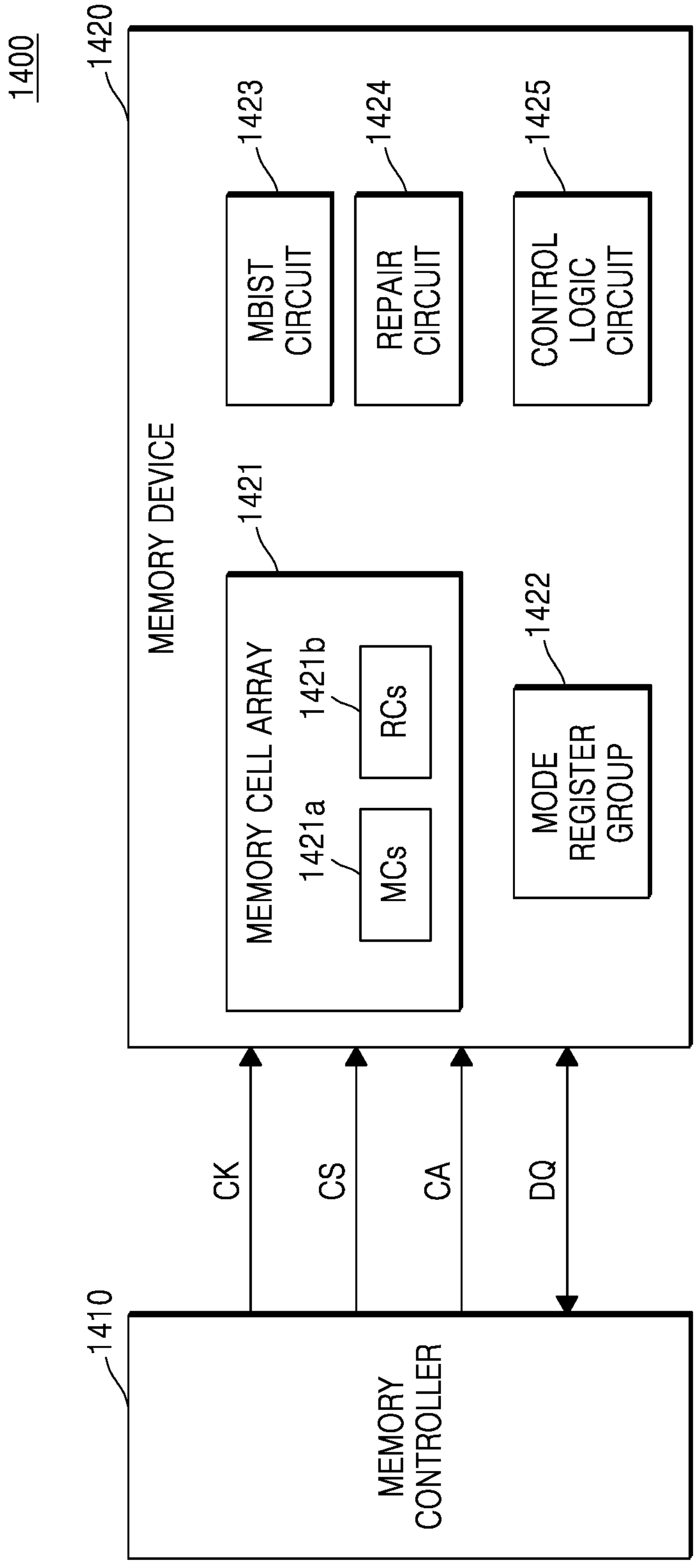
FIG. 14 is a block diagram illustrating a memory device according to embodiments of the present disclosure.

FIG. 14 is a block diagram illustrating a memory device according to embodiments of the present disclosure.

Referring to FIG. 14, a memory system 1400 may include a memory controller 1410 and a memory device 1420.

The memory controller 1410 may perform operations described above with reference to FIGS. 1 to 13.

The memory controller 1410 and the memory device 1420 may be electrically connected to each other via a clock channel CK, a chip selection channel CS, a command/address channel CA, and a data channel DQ respectively corresponding thereto. The clock channel CK, the chip selection channel CS, the command/address channel CA, and the data channel DQ may satisfy the DDR5 specification of the JEDEC.

The memory device 1420 may correspond to a memory chip described above. The memory device 1420 may operate as a master memory chip or a mirror memory chip in a mirroring mode.

The memory device 1420 may include a memory cell array 1421, a mode register group 1422, an MBIST circuit 1423, a repair circuit 1424, and a control logic circuit 1425.

The memory cell array 1421 may include a plurality of memory cells 1421*a* and a plurality of redundancy memory cells 1421*b*. Each of the plurality of memory cells 1421*a* may be connected to a word line and a bit line. Each of the plurality of redundancy memory cells 1421*b* may be connected to a redundancy word line and a redundancy bit line. When a defective memory cell is present from among the plurality of memory cells 1421*a*, the defective memory cell may be replaced with a redundancy memory cell.

The mode register group 1422 may store a bit value of a flag signal described above, and bit values of physical addresses of memory cells on which an MBIST is performed. Here, the bit value of the flag signal may be referred to as a flag bit value. The flag bit value may be a value for notifying whether or not to partially perform the MBIST on the plurality of memory cells 1421*a*. In other words, the flag bit value may be a value for notifying whether or not to perform the MBIST on some memory cells from among the plurality of memory cells 1421*a*. For example, the flag bit value may indicate that the MBIST should be performed on a specific portion of the memory cells, rather than all of the plurality of memory cells 1421*a*.

In some embodiments, the number and capacity of mode registers are limited, and thus, the mode register group 1422 may store at least some bit values from among bit values of physical addresses of memory cells on which the MBIST is performed.

In some embodiments, the mode register group 1422 may include a plurality of mode registers. For example, the plurality of mode registers may include a mode register for storing the flag bit value, and at least one mode register for storing bit values of physical addresses of memory cells on which the MBIST is performed.

The MBIST circuit 1423 may perform the MBIST on some memory cells from among the plurality of memory cells 1421*a*. Here, some memory cells may be memory cells corresponding to at least some bit values of physical addresses of memory cells on which the MBIST is performed. In some embodiments, the MBIST circuit 1423 may generate test patterns for detecting a defective memory cell within the plurality of memory cells 1421*a*, may write the test patterns into the plurality of memory cells 1421*a*, may read the test patterns from the plurality of memory cells 1421*a*, and may output test results on the basis of the read test patterns. The MBIST may satisfy an operation sequence defined in the DDR5 specification of the JEDEC.

The repair circuit 1424 may perform a repair operation of replacing a defective memory cell detected via a test result of the MBIST with a redundancy memory cell. The repair operation may be performed, for example, to replace a defective row address and/or a defective column address corresponding to the defective memory cell with a redundancy row address and/or a redundancy column address. The replaced address may be stored in an address table. The repair operation may be an mPPR defined in the DDR5 specification of the JEDEC.

Figure 15:
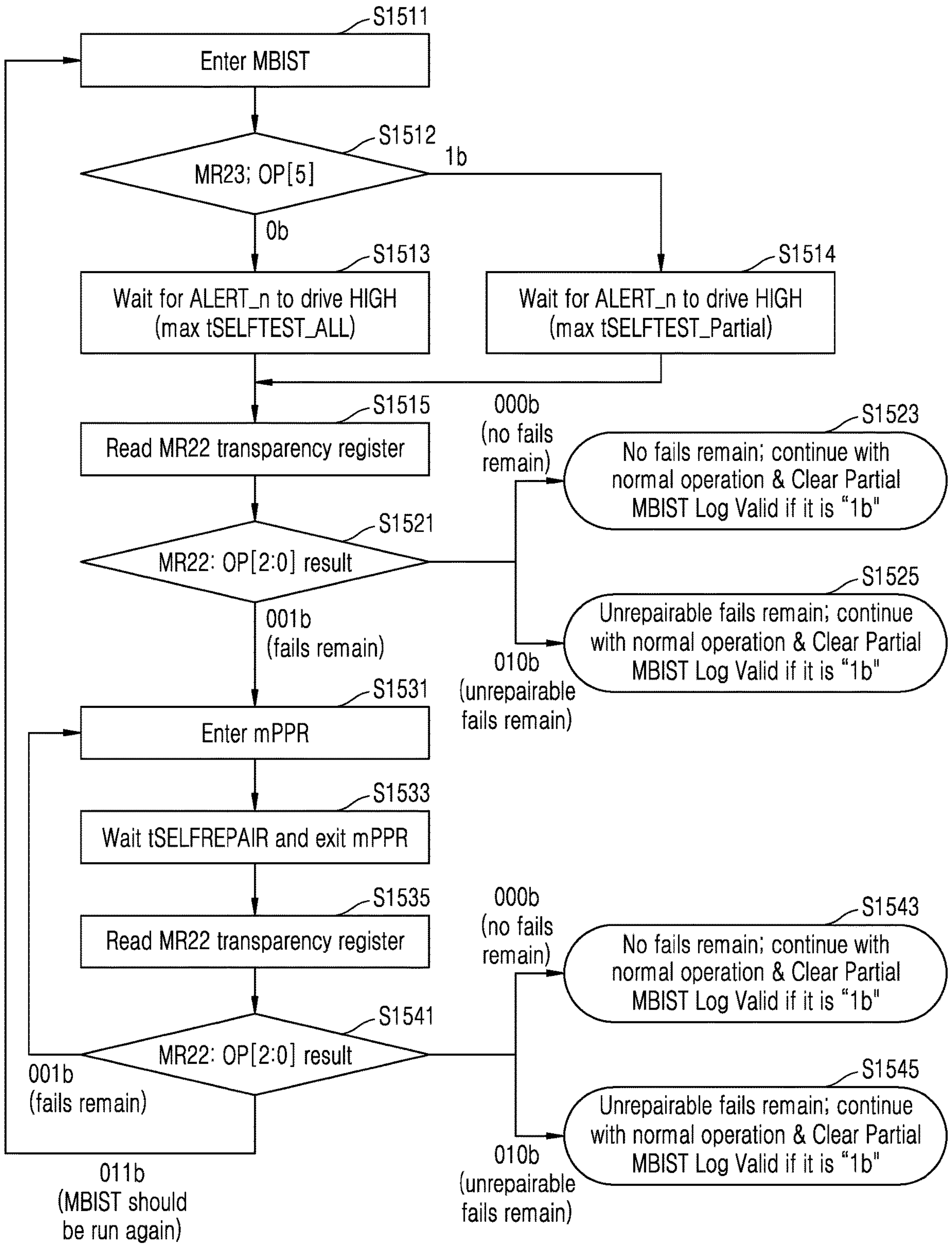
FIG. 15 is a flowchart illustrating an MBIST and an mPPR according to embodiments of the present disclosure.

FIG. 15 is a flowchart illustrating an MBIST and an mPPR according to embodiments of the present disclosure.

Referring to FIGS. 14 and 15, an MBIST and an mPPR illustrated in FIG. 15 may follow a sequence defined in the DDR5 specification of the JEDEC.

In operation S1511, the MBIST is entered. The memory controller 1410 may provide a mode register write command to the memory device 1420. For example, an address (e.g., MRA) of a mode register 23 (e.g., MR23) included in the memory device 1420 is written. In addition, a bit value of an operation code 4 (e.g., OP[4]) of the mode register 23 (e.g., MR23) is written as 1 (or a logic high level). An address (e.g., MRA) of a mode register 24 (e.g., MR24) included in the memory device 1420 is written. A guard key is written into the mode register 24 (e.g., MR24) included in the memory device 1420. As a logic value (e.g., ALERT_n) of an alert output driver is changed from a logic high level to a logic low level, the MBIST is performed within the memory device 1420.

In operation S1512, an operation of checking a bit value of an operation code 5 (e.g., OP[5]) of the mode register 23 (e.g., MR23) included in the memory device 1420 is performed. A flag bit value may be stored in the operation code 5 (e.g., OP[5]) of the mode register 23 (e.g., MR23). An embodiment of the mode register 23 (e.g., MR23) will be described below with reference to FIG. 17. The flag bit value may correspond to Partial MBIST Log Valid illustrated in FIG. 17.

When the bit value of the operation code 5 (e.g., OP[5]) of the mode register 23 (e.g., MR23) is 0b, in operation S1513, an operation of waiting is performed until the logic value (e.g., ALERT_n) of the alert output driver is driven from the logic low level to the logic high level. Once the MBIST is completed, the logic value (e.g., ALERT_n) of the alert output driver is changed from the logic low level to the logic high level. In operation S1513, a waiting time may be related to a self-test time (e.g., tSELFTEST) defined in the specification of the JEDEC. For example, in operation S1513, the waiting time may be a maximum value (e.g., max tSELFTEST_ALL) of a time (e.g., tSELFTEST_ALL) taken to perform the MBIST on all memory cell rows. The maximum value (e.g., max tSELFTEST_ALL) of the time (e.g., tSELFTEST_ALL) described above may be reflected in the specification of the JEDEC in the future.

The self-test time (e.g., tSELFTEST) currently defined in the specification of the JEDEC may be a maximum of 9 seconds in 8 Gb or 16 Gb DRAM, 14 seconds in 24 Gb DRAM, and 19 seconds in 32 Gb DRAM. A maximum value (e.g., max tSELFTEST_ALL) of a time (e.g., tSELFTEST_ALL) to be defined in the specification of the JEDEC in the future may be the same as the self-test time (e.g., tSELFTEST) currently defined in the specification of the JEDEC.

When the bit value of the operation code 5 (e.g., OP[5]) of the mode register 23 (e.g., MR23) is 1b, in operation S1514, an operation of waiting is performed until the logic value (e.g., ALERT_n) of the alert output driver is driven from the logic low level to the logic high level. Once the MBIST is completed, the logic value (e.g., ALERT_n) of the alert output driver is changed from the logic low level to the logic high level. In operation S1514, a waiting time may be related to the self-test time (e.g., tSELFTEST) defined in the specification of the JEDEC. For example, in operation S1514, the waiting time may be a maximum value (e.g., max tSELFTEST_partial) of a time (tSELFTEST_partial) taken to partially perform the MBIST on some memory cell rows. The maximum value (e.g., max tSELFTEST_partial) of the time (e.g., tSELFTEST_partial) described above may be reflected in the specification of the JEDEC in the future, and may be a value in milliseconds (ms) to be determined or to be decided (TBD).

When the MBIST is completed in operation S1513 or operation S1514, a mode register 22 (e.g., MR22) included in the memory device 1420 may be updated. For example, whether or not an mPPR needs to be performed to repair any detected fails may be recorded in the mode register 22 (e.g., MR22). In other words, MBIST and mPPR transparency (e.g., MBIST/mPPR Transparency) may be recorded in the mode register 22 (e.g., MR22). In the MBIST and mPPR transparency (e.g., MBIST/mPPR Transparency), information regarding whether or not the MBIST runs again, whether or not fails remain, and whether or not unrepairable fails remain may be recorded.

In operation S1515, the memory controller 1410 may read transparency of the mode register 22 (e.g., MR22) of the memory device 1420. For example, the memory controller 1410 may issue a mode register read command (e.g., MRR) for reading the mode register 22 (e.g., MR22).

In operation S1521, an operation of checking a result of an operation code 2:0 (e.g., OP[2:0]) of the mode register 22 (e.g., MR22) is performed.

When the operation code 2:0 (e.g., OP[2:0]) of the mode register 22 (e.g., MR22) is 000b, in operation S1523, no fails remain, and thus, a normal operation continues. When the flag bit value (e.g., Partial MBIST Log Valid illustrated in FIG. 15) is 1b, an operation of clearing the flag bit value is performed.

When the operation code 2:0 (e.g., OP[2:0]) of the mode register 22 (e.g., MR22) is 010b, in operation S1525, unrepairable fails remain, and the normal operation continues. When the flag bit value (e.g., Partial MBIST Log Valid illustrated in FIG. 15) is 1b, an operation of clearing the flag bit value is performed.

When the operation code 2:0 (e.g., OP[2:0]) of the mode register 22 (e.g., MR22) is 001b, in operation S1531, the mPPR is entered. The memory controller 1410 may provide a mode register write command to the memory device 1420. For example, the address (e.g., MRA) of the mode register 23 (e.g., MR23) included in the memory device 1420 is written. In addition, a bit value of an operation code 3 (e.g., OP[3]) of the mode register 23 (e.g., MR23) is written as 1 (or a logic high level). An address (e.g., MRA) and a guard key of a mode register 24 (e.g., MR24) included in the memory device 1420 are written.

In operation S1533, an operation of waiting for a self-repair time (e.g., tSELFREPAIR) and an operation of exiting the mPPR after the self-repair time (e.g., tSELFREPAIR) are performed. The mPPR may be performed during the self-repair time (e.g., tSELFREPAIR), and a defective memory cell may be replaced with a redundancy memory cell within the self-repair time (e.g., tSELFREPAIR). When the bit value of the operation code 3 (e.g., OP[3]) of the mode register 23 (e.g., MR23) is written as 0 (or a logic low level), the mPPR is exited.

In operation S1535, the memory controller 1410 may read the transparency of the mode register 22 (e.g., MR22) of the memory device 1420. The operation according to operation S1535 is the same as the operation according to operation S1515.

In operation S1541, an operation of checking a result of the operation code 2:0 (e.g., OP[2:0]) of the mode register 22 (e.g., MR22) is performed. The operation according to operation S1541 is the same as the operation according to operation S1521.

In the same manner as the operations according to operations S1523 and S1525, operation S1543 or operation S1545 is performed according to the operation code 2:0 of the mode register 22 (e.g., MR22). For example, in operation S1523, since no fails remain and the operation code 2:0 is 000b, the normal operation continues, and in operation S1525, since unrepairable fails remain and the operation code 2:0 is 010b, the normal operation continues.

When the operation code 2:0 (e.g., OP[2:0]) of the mode register 22 (e.g., MR22) is 011b, the MBIST runs again.

FIG. 16 is a diagram illustrating a mode register 22 according to the specification of the JEDEC.

Referring to FIG. 16, a mode register 22 1600 may store operation codes OP[7:0] according to the DDR5 specification of the JEDEC. The DDR5 specification is incorporated by reference herein in its entirety. In a field 1610 indicating an operation code 0 OP0 to an operation code 7 OP7 according to the DDR 5 specification of the JEDEC, an operation code 2:0 (OP[2:0]) may optionally indicate a function of MBIST and mPPR transparency MBIST/mPPR Transparency. In a field 1620 indicating the MBIST and mPPR transparency MBIST/mPPR Transparency, 000b to 011b may indicate functions defined in the DDR5 specification of the JEDEC. In the field 1620 indicating the MBIST and mPPR transparency MBIST/mPPR Transparency, 100b to 111b may be reserved to implement operations designed in the future.

Figure 17:
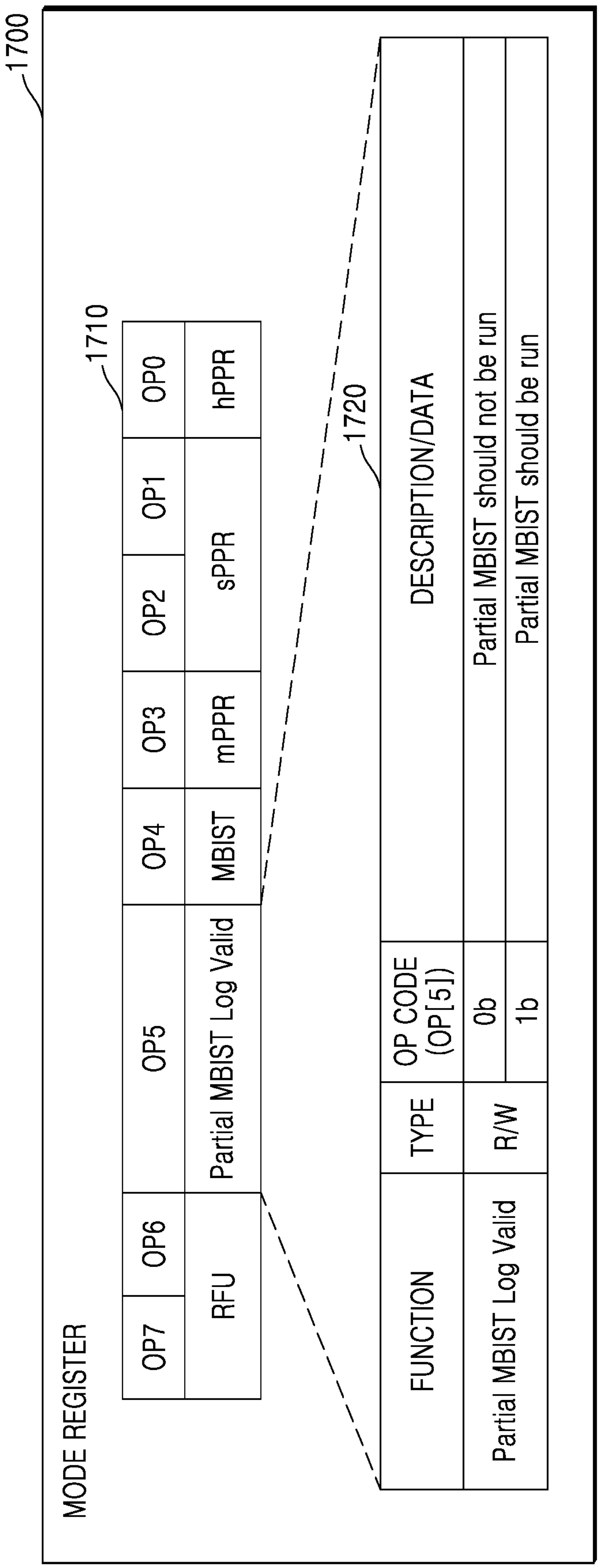
FIG. 17 is a diagram illustrating a first mode register according to embodiments of the present disclosure.

FIG. 17 is a diagram illustrating a first mode register according to embodiments of the present disclosure.

Referring to FIG. 17, a first mode register 1700 may store a flag bit value. In some embodiments, the first mode register 1700 may be implemented as a mode register 23 (e.g., MR23). When the first mode register 1700 is implemented as the mode register 23 (e.g., MR23), in a field 1710 indicating an operation code 0 OP0 to an operation code 7 OP7 according to the DDR5 specification of the JEDEC, a flag bit value may be stored in the operation code 5 OP5. The flag bit value may correspond to Partial MBIST Log Valid a field 1720 illustrated in FIG. 17. When the flag bit value is 0b, a partial MBIST is not performed. Here, the partial MBIST may be an MBIST performed on some memory cells from among the plurality of memory cells 1421*a*. When the flag bit value is 1b, the partial MBIST is performed.

FIG. 17 illustrates that the flag bit value is stored in the operation code 5 (OP[5]) of the mode register 23 (e.g., MR23), but embodiment is not limited thereto. In some embodiments, the flag bit value (or flag bit values) may be stored in an operation code 7:6 (OP[7:6]) of the mode register 23 (e.g., MR23). In some embodiments, the flag bit value may also be stored in one or more operation codes of any one mode register from among mode registers (e.g., MR41, MR49, MR70 to MR102) allocated to be RFU currently in the DDR5 specification of the JEDEC.

When an mPPR for the partial MBIST is completed, the memory device 1420 may update the operation code 5 OP[5] of the first mode register 1700. For example, the operation code 5 OP[5] of the field 1710 may be changed from 1b to 0b. In other words, the flag bit value may be cleared.

The memory controller 1410 may determine to exit the partial MBIST by generating a mode register read command for reading the first mode register 1700, and reading the operation code 5 (OP[5]) of the field 1710.

In FIG. 17, the first mode register 1700 is implemented as the mode register 23 (e.g., MR23), but is not limited thereto. In some embodiments, the first mode register 1700 may also be implemented as any one mode register from among the mode registers (e.g., MR41, MR49, MR70 to MR102) currently allocated to be RFU currently in the DDR5 specification of the JEDEC. Accordingly, the flag bit value may include two or more bit digits, e.g., two or more bit values. Here, the flag bit value may have a first bit value indicating to partially perform an MBIST on some memory cells or a second bit value indicating to fully perform the MBIST on a plurality of memory cells.

Figure 18:
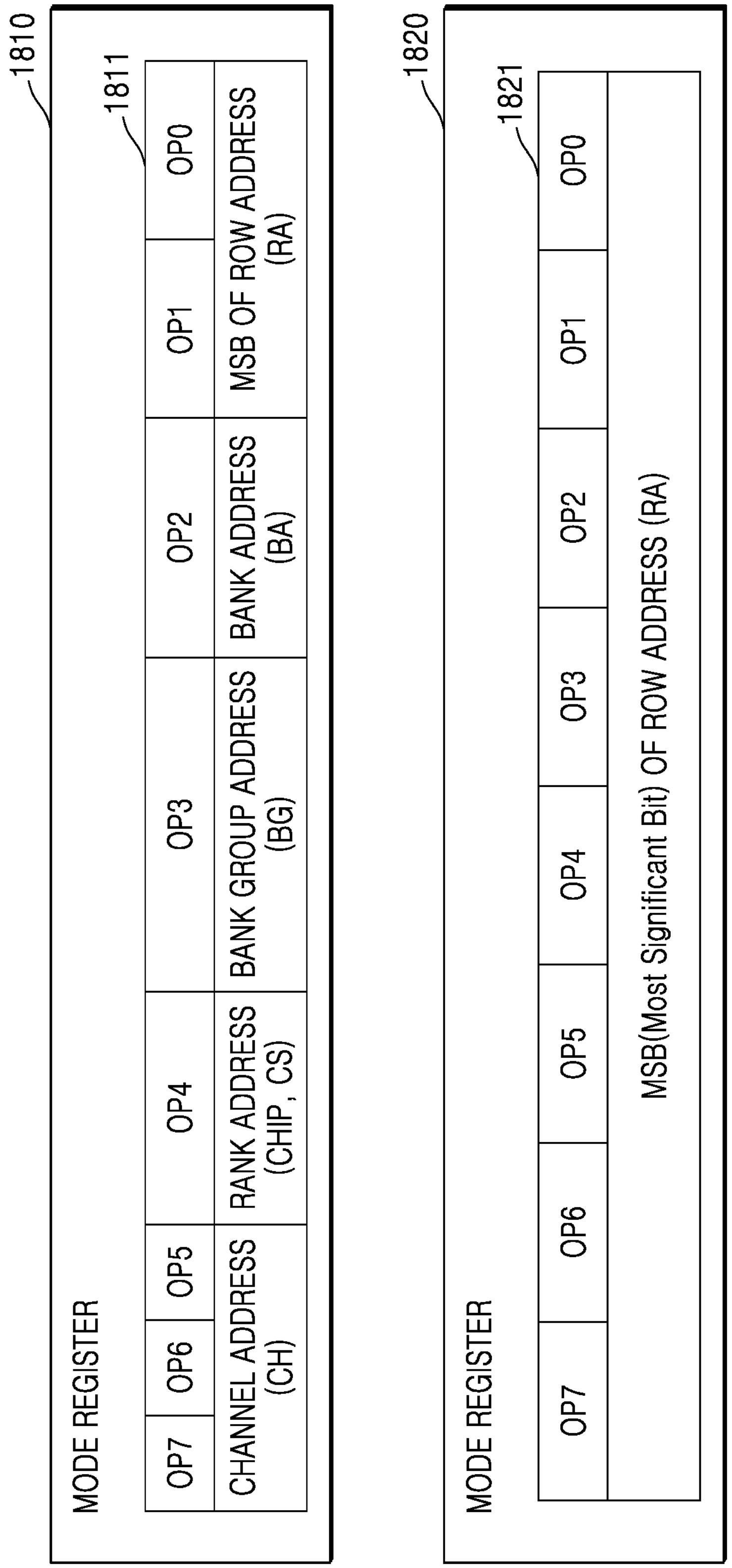
FIG. 18 is a diagram illustrating at least one mode register for storing a page offline address, according to embodiments of the present disclosure.

FIG. 18 is a diagram illustrating at least one mode register for storing a page offline address, according to embodiments of the present disclosure.

Referring to FIG. 18, in some embodiments, from among the mode registers (e.g., MR41, MR49, MR70 to MR102) allocated to be RFU currently in the DDR5 specification of the JEDEC, one mode register may store a page offline address. For example, a mode register 41 (e.g., MR41) may store the page offline address. However, embodiment is not limited thereto. The page offline address may include at least some bit values from among bit values of physical addresses of memory cells on which an MBIST is performed.

From among the mode registers (e.g., MR41, MR49, MR70 to MR102) allocated to be RFU currently in the DDR 5 specification of the JEDEC, one mode register that stores the page offline address may be referred to as a second mode register 1810 according to some embodiments.

In a field 1811 of the second mode register 1810, at least some bit values from among bit values of physical addresses of some memory cells on which the MBIST is performed, e.g., the page offline address, may include higher bits of a channel address, a rank address, a bank group address, a bank address, and a row address. The channel address may be an address indicating a channel connected to the memory device 1420 (or a memory module including the memory device 1420). The rank address may be an address indicating a rank of the memory device 1420 (or the memory module including the memory device 1420). The rank address may be referred to as a chip address. The bank group address may be an address indicating a bank group of the memory cell array 1421. The bank address may be an address indicating a bank of the memory cell array 1421. The row address may indicate a memory cell row (or a row) of the memory cell array 1421. When all of a most significant bit (MSB) to a least significant bit (LSM) of the row address are specified or particularized, one memory cell row or one page may be selected. When a higher bit of the row address is specified or particularized, memory cell rows equally having the corresponding higher bit may be selected. In other words, the higher bit of the row address described above may indicate two or more memory cell rows.

In the field 1811, an operation code 7:5 (e.g., OP[7:5]) may include bit values of the channel address, an operation code 4 (e.g., OP4) may include a bit value of the rank address, an operation code 3 (e.g., OP3) may include a bit value of the bank address, an operation code 2 (e.g., OP2)

may include a bit value of the bank address, an operation code 1:0 (e.g., OP[1:0]) may include an MSB of the row address.

According to the single second mode register 1810 that stores the page offline address, the MSB of the row address may be stored up to 2 bits. In addition, an MBIST and an mPPR may be performed on memory cell rows (e.g., pages) commonly having the MSB of the row address.

In some embodiments, from among the mode registers (e.g., MR41, MR49, MR70 to MR102) allocated to be RFU currently in the DDR5 specification of the JEDEC, two mode registers may store the page offline address. For example, the mode register 41 (e.g., MR41) may store a portion of the page offline address, and a mode register 49 (e.g., MR49) may store the remaining portion of the page offline address. However, embodiment is not limited thereto.

The portion of the page offline address may include higher bits of the channel address, the rank address, the bank group address, the bank address, and the row address, and the remaining portion of the page offline address may include other higher bits of the row address. A mode register storing the portion of the page offline address may be referred to as the second mode register 1810 according to some embodiments. A mode register storing the remaining portion of the page offline address may be referred to as a third mode register 1820 according to some embodiments.

In a field 1821 of the third mode register 1820, an operation code 7:0 (e.g., OP[7:0]) may include higher bit values of a row of the memory cell array 1421. In another example, an operation code 7:0 (e.g., OP[7:0]) may include bit values indicating a row of a mirror memory module. The MSB of the row address may be stored up to 2 bits in the second mode register 1810, and the MSB of the row address may be stored up to 8 bits in the third mode register 1820. Accordingly, according to the second and third mode registers 1810 and 1820, the MSB of the row address may be stored up to 10 bits.

In some embodiments, from among the mode registers (e.g., MR41, MR49, MR70 to MR102) allocated to be RFU currently in the DDR5 specification of the JEDEC, three or more mode registers may store the page offline address.

As the number of mode registers allocated to be RFU currently in the DDR5 specification of the JEDEC is greater to store the page offline address, the smaller number of memory cell rows are specified or particularized, and thus, a partial MBIST may be performed on the relatively small number of memory cell rows.

As the number of mode registers allocated to be RFU currently in the DDR5 specification of the JEDEC is smaller to store the page offline address, the partial MBIST may be performed while using a relatively small number of mode registers.

Figure 19:
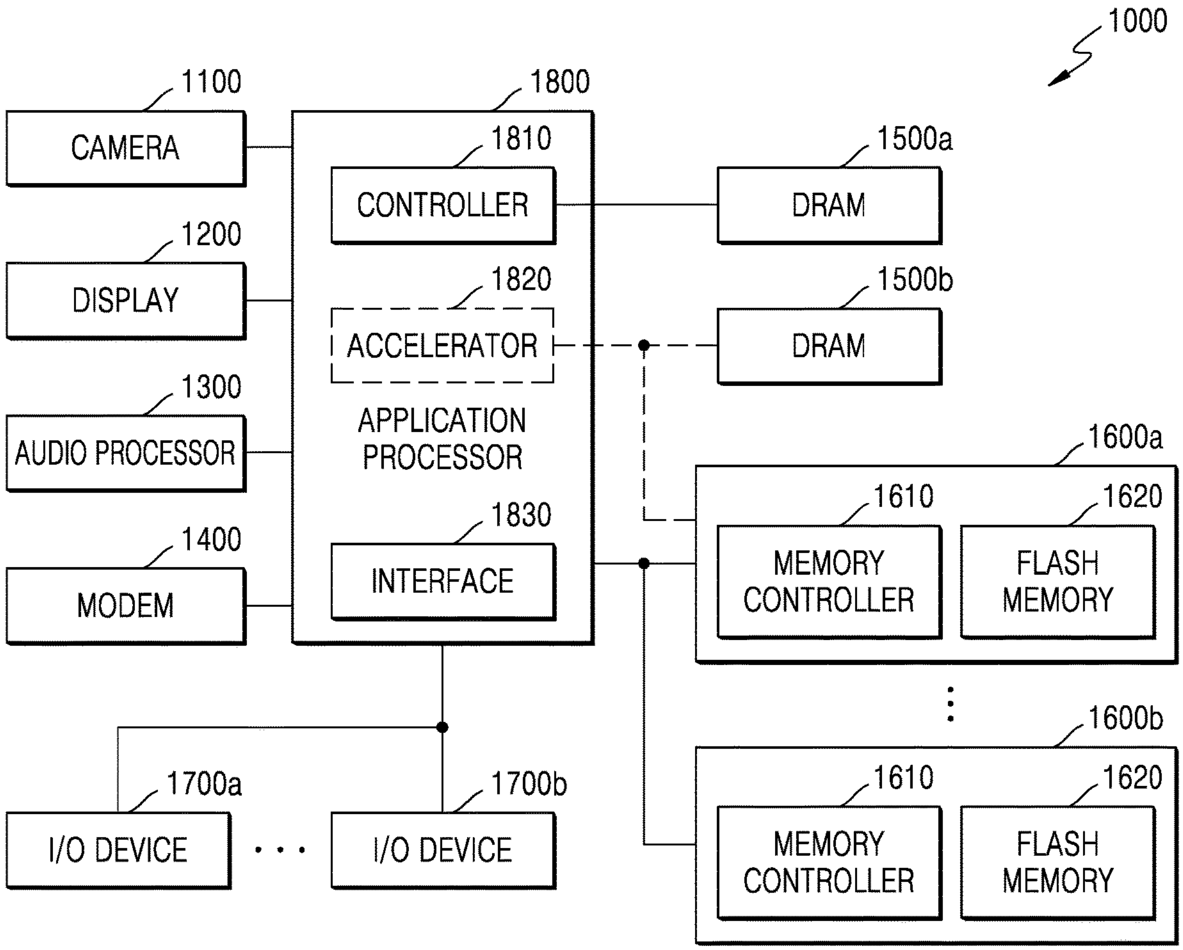
FIG. 19 is a block diagram illustrating an electronic system according to embodiments of the present disclosure.

FIG. 19 is a block diagram illustrating an electronic system according to embodiments of the present disclosure.

Referring to FIG. 19, an electronic system 1000 may include a camera 1100, a display 1200, an audio processor 1300, a modem 1400, volatile memories 1500*a* and 1500*b*, flash memories 1600*a* and 1600*b*, I/O devices 1700*a* and 1700*b*, and an AP 1800. The electronic system 1000 may be implemented as a server, but is not limited thereto.

The camera 1100 may capture a still image or a moving image according to control of a user.

The audio processor 1300 may process audio data included in the flash memories 1600*a* and 1600*b* or content of a network.

The modem 1400 may, for wired/wireless data transmission and reception, modulate and transmit a signal, and demodulate the signal to recover to an original signal at a reception side.

The I/O devices 1700*a* and 1700*b* may include devices for providing digital input and/or output functions.

The AP 1800 may control the overall operation of the electronic system 1000. The AP 1800 may control the display 1200 to display a portion of content. When a user input is received via the I/O devices 1700*a* and 1700*b*, the AP 1800 may perform a control operation corresponding to the user input. The AP 1800 may include an accelerator 1820 that is a dedicated circuit for an artificial intelligence (AI) data calculation. The volatile memory 1500*b* may be additionally mounted on the accelerator 1820. The accelerator 1820 may be a functional block for performing a particular function of the AP 1800. The accelerator 1820 may include a graphic processing unit (GPU), a neural processing unit (NPU), and a data processing unit (DPU). The GPU may be a block for performing graphic data processing. The NPU may be a block for performing an AI calculation and inference. The DPU may be a block for performing data transmission.

The AP 1800 may control the volatile memories 1500*a* and 1500*b* via commands and mode register settings (e.g., MRS) that meet the JEDEC standard specification. Alternatively, the AP 1800 may set up DRAM interface protocols to use company-specific functions, such as low voltage/high speed/reliability, and cyclic redundancy check (CRCyerror correction code (ECC) functions. The AP 1800 may further include a controller 1810 and an interface 1830.

The volatile memories 1500*a* and 1500*b* have relatively smaller latency and bandwidth than the I/O devices 1700*a* and 1700*b* or the flash memories 1600*a* and 1600*b*. The volatile memories 1500*a* and 1500*b* may be initialized when the electronic system 1000 is powered on, and may be loaded with an operating system and application data and thus may be used as a temporary storage for the operating system and application data, or may be used as an execution space for various software codes.

The four fundamental arithmetic operations of addition/subtraction/multiplication/division, vector operations, address operations, or Fast Fourier Transform (FFT) operations may be performed within the volatile memories 1500*a* and 1500*b*. In addition, a function for performance used for inference may be performed within the volatile memories 1500*a* and 1500*b*.

Each of the volatile memories 1500*a* and 1500*b* may be included in each memory module described above with reference to FIG. 1.

The flash memories 1600*a* and 1600*b* may store photos taken through the camera 1100, or may store data transmitted via a data network. The flash memories 1600*a* and 1600*b* may have capacities that are greater than capacities of the volatile memories 1500*a* and 1500*b*. The flash memory 1600*a* and 1600*b* may each include a memory controller 1610 and a flash memory 1620.

While certain embodiments of the present disclosure have been particularly shown and described, it will be understood that various changes in form and details may be made therein without departing from the spirit and scope of the present disclosure as set forth in the following claims.

What is claimed is:

1. A memory system comprising:

a memory module including a plurality of memory chips;

a mirror memory module including a plurality of mirror memory chips corresponding to the plurality of memory chips, a first mirror memory chip of the plurality of mirror memory chips being storing same data as a first memory chip of the plurality of memory chips; and a memory controller configured to, in a system running state in which an operation according to a request of a user is capable of being performed after the memory system is booted, provide the memory module with a command for instructing a normal operation to be performed and provide the mirror memory module with a command for instructing a memory built-in self-test (MBIST) to be performed, wherein the MBIST is partially performed on the mirror memory module simultaneously with the normal operation performed on the memory module.

2. The memory system of claim 1, wherein the memory controller is configured to: execute a mirroring mode that is set when booting the memory system; provide, in the mirroring mode, the memory module and the mirror memory module with a write command for storing data in each of the first memory chip and the first mirror memory chip; and when the mirroring mode is released, provide the mirror memory module with the command for instructing the MBIST to be performed.

3. The memory system of claim 1, wherein the memory controller is configured to: execute a mirroring mode that is set when booting the memory system; in the mirroring mode, provide the memory module with a read command for reading data stored in the first memory chip; in the mirroring mode, provide the mirror memory module with a read command for reading data stored in the first mirror memory chip, according to a state of an error occurring in data read from the first memory chip; and when the mirroring mode is released, provide the mirror memory module with the command for instructing the MBIST to be performed.

4. The memory system of claim 1, wherein the memory controller is configured to: after the MBIST is completed, provide the memory module with a read command for reading data stored in the plurality of memory chips; and provide the mirror memory module with a write command for storing, in the plurality of mirror memory chips, data read from the memory module.

5. The memory system of claim 1, wherein the memory controller is configured to provide the mirror memory module with a command for instructing a memory built-in self-test post package repair (mPPR) to be performed, according to a test result of the MBIST.

6. The memory system of claim 1, wherein the memory controller is configured to: execute a mirroring mode that is set when booting the memory system; and, in the mirroring mode, when an error occurs in data provided from the memory module, provide the mirror memory module with a command for logging, into a mode register of the first mirror memory chip, a physical address of the first mirror memory chip corresponding to a physical address of the first memory chip storing the data.

7. The memory system of claim 6, wherein the memory controller includes:

a page offline detector configured to detect an operating system address corresponding to the data having the error;

an address decoder configured to decode the operating system address into a particular physical address of the mirror memory module;

an address register configured to store a page offline address including at least some bit values from among bit values of the particular physical address; and a command generator configured to output, to the mirror memory module, a first mode register write command for writing, into a first mode register, a bit value of a flag signal that indicates whether or not to partially perform the MBIST on some memory cells within the mirror memory module, which are defined by the particular physical address, and a second mode register write command for writing the page offline address into a second mode register.

8. The memory system of claim 7, wherein the command generator is configured to provide the mirror memory module with the command for instructing the MBIST to be performed when the mirroring mode is released or the memory system is booted.

9. The memory system of claim 1, wherein the memory controller is configured to: in the system running state, swap channels with each other by changing a first channel connected to the memory module to a mirror channel, and changing a second channel connected to the mirror memory module to a master channel, wherein the memory module connected to the mirror channel operates as a mirror memory module, and the mirror memory module connected to the master channel operates as a master mirror module; and output, via the mirror channel, the command for instructing the MBIST to be performed.

10. An operation method of a memory controller configured to communicate with a memory module and a mirror memory module, the operation method comprising:

executing a mirroring mode in a system running state, the mirroring mode being executed to equally store, in the mirror memory module, data stored in the memory module; and after the mirroring mode is released, providing the mirror memory module with a command for instructing a memory built-in self-test (MBIST) to be performed.

11. The operation method of claim 10, wherein the executing the mirroring mode includes:

providing the memory module with a write command for storing data in a target memory chip from among a plurality of memory chips included in the memory module; and providing the mirror memory module with a write command for storing the data in a target mirror memory chip corresponding to the target memory chip, from among a plurality of mirror memory chips included in the mirror memory module.

12. The operation method of claim 10, wherein the executing the mirroring mode includes:

providing the memory module with a read command for reading data in a target memory chip from among a plurality of memory chips included in the memory module; and according to a state of an error occurring in data read from the target memory chip, providing the mirror memory module with a read command for reading data stored in a target mirror memory chip corresponding to the target memory chip, from among a plurality of mirror memory chips included in the mirror memory module.

13. The operation method of claim 10, further comprising copying data after the MBIST is completed, wherein the copying the data includes: providing the memory module with a read command for reading data stored in the memory module; and providing the mirror memory module with a write command for storing data read from the memory module.

14. The operation method of claim 10, wherein the executing the mirroring mode includes:

for data having an error, provided from the memory module, detecting an operating system address corresponding to the data;

decoding the operating system address into a physical address of the mirror memory module;

storing a page offline address including at least some bit values from among bit values of the physical address;

outputting, to the mirror memory module, a first mode register write command for writing, into a first mode register, a bit value of a flag signal that indicates whether or not to partially perform the MBIST on some memory cells within the mirror memory module, defined by the physical address; and outputting, to the mirror memory module, a second mode register write command for writing the page offline address into a second mode register.

15. The operation method of claim 10, further comprising swapping the memory module and the mirror memory module with each other, wherein the swapping includes, in the system running state, changing, by the memory controller, a channel connected to the memory module to a mirror channel, and changing a mirror channel connected to the mirror memory module to a master channel, such that the memory module connected to the mirror channel operates as a mirror memory module, and the mirror memory module connected to the master channel operates as a master memory module.

* * * * *